US010692457B2

United States Patent
Imajo et al.

(10) Patent No.: US 10,692,457 B2
(45) Date of Patent: Jun. 23, 2020

(54) DRIVE CIRCUIT HAVING OUTPUT TRANSISTOR WITH ON-RESISTANCE VALUE AND DISPLAY DEVICE THEREWITH

(71) Applicant: Panasonic Liquid Crystal Display Co., Ltd., Himeji-shi, Hyogo (JP)

(72) Inventors: Yoshihiro Imajo, Hyogo (JP); Masahiro Ishii, Hyogo (JP); Kenta Endo, Hyogo (JP); Tetsuo Fukami, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 56 days.

(21) Appl. No.: 15/864,836

(22) Filed: Jan. 8, 2018

(65) Prior Publication Data

US 2018/0130438 A1 May 10, 2018

Related U.S. Application Data

(63) Continuation of application No. PCT/JP2016/003231, filed on Jul. 7, 2016.

(30) Foreign Application Priority Data

Jul. 7, 2015 (JP) ................. 2015-136534

(51) Int. Cl.
*G09G 3/36* (2006.01)
*G09G 3/20* (2006.01)
*G11C 19/28* (2006.01)

(52) U.S. Cl.
CPC ............. *G09G 3/3685* (2013.01); *G09G 3/20* (2013.01); *G09G 3/36* (2013.01); *G09G 3/3677* (2013.01); *G11C 19/28* (2013.01); *G09G 2310/0286* (2013.01); *G09G 2320/02* (2013.01); *G09G 2320/0223* (2013.01)

(58) Field of Classification Search
CPC ... G09G 2310/0286; G09G 2320/0223; G09G 3/3674; G09G 3/3677; G09G 3/3685; G09G 3/3688; G02F 1/136286; G02F 1/1345

See application file for complete search history.

(56) References Cited

U.S. PATENT DOCUMENTS

| | | | |
|---|---|---|---|
| 5,757,450 | A | 5/1998 | Fujii et al. |
| 5,914,763 | A | 6/1999 | Fujii et al. |
| 6,151,006 | A | 11/2000 | Yanagi et al. |

(Continued)

FOREIGN PATENT DOCUMENTS

| | | |
|---|---|---|
| JP | 57-140704 | 9/1982 |
| JP | 2-156224 | 6/1990 |

(Continued)

*Primary Examiner* — Yuzhen Shen
(74) *Attorney, Agent, or Firm* — Hamre, Schumann, Mueller & Larson, P.C.

(57) ABSTRACT

A driving circuit including an output circuit that outputs a signal to a lead line electrically connected to a signal line provided in a display panel; and an output transistor that is provided in the output circuit and connected to an output terminal of the output circuit. An on-resistance value of the output transistor is set according to a resistance value of the lead line electrically connected to the output transistor.

3 Claims, 23 Drawing Sheets

(56) References Cited

U.S. PATENT DOCUMENTS

| | | | |
|---|---|---|---|
| 6,437,764 B1* | 8/2002 | Suzuki | G02F 1/13452 |
| | | | 345/87 |
| RE41,324 E | 5/2010 | Tatsuhisa | |
| RE42,879 E | 1/2011 | Tatsuhisa | |
| 2008/0018567 A1 | 1/2008 | Minami | |
| 2010/0141570 A1* | 6/2010 | Horiuchi | G09G 3/3611 |
| | | | 345/100 |
| 2012/0105392 A1 | 5/2012 | Nagami | |
| 2014/0313185 A1* | 10/2014 | Li | G09G 3/20 |
| | | | 345/214 |
| 2016/0103348 A1 | 4/2016 | Nagami | |
| 2017/0123285 A1* | 5/2017 | Suzuki | G02F 1/13306 |
| 2017/0212624 A1* | 7/2017 | Katsuta | G06F 3/0412 |

FOREIGN PATENT DOCUMENTS

| | | |
|---|---|---|
| JP | 7-134305 | 5/1995 |
| JP | 8-076136 | 3/1996 |
| JP | 8-211853 | 8/1996 |
| JP | 9-153296 | 6/1997 |
| JP | 2000-293143 | 10/2000 |
| JP | 2001-154632 | 6/2001 |
| JP | 2002-189437 | 7/2002 |
| JP | 2005-099414 | 4/2005 |
| JP | 2008-026513 | 2/2008 |
| JP | 2010-107655 | 5/2010 |
| JP | 2012-098464 | 5/2012 |

* cited by examiner

DRIVE CIRCUIT HAVING OUTPUT TRANSISTOR WITH ON-RESISTANCE VALUE AND DISPLAY DEVICE THEREWITH

CROSS-REFERENCE TO RELATED APPLICATION

This application is a bypass continuation of international patent application PCT/JP2016/003231, filed on Jul. 7, 2016 designating the United States of America. Priority is claimed based on a Japanese patent application JP2015-136534, filed on Jul. 7, 2015. The entire disclosures of these international and Japanese patent applications are incorporated herein by reference in their entirety.

TECHNICAL FIELD

The present disclosure relates to a drive circuit and a display device provided with the drive circuit.

BACKGROUND

For example, in a display region of the display device, gate lines extend in a row direction (horizontal direction) and are arrayed at a predetermined pitch in a column direction (vertical direction), and data lines extend in the column direction and are arrayed at a predetermined pitch in the row direction. A data signal is supplied from a source driver IC to the data line, and a gate signal is supplied from a gate driver IC to the gate line. Because a pitch of a terminal of the driver IC is smaller than a pitch of a signal line (data line, gate line), a length of the lead line that relays the terminal of the driver IC and the signal line varies depending on a place.

When the length of the lead line varies, an electric resistance from the terminal of the driver IC to the signal line varies depending on the place. Resultantly, a luminance difference is generated in a display region, and display quality is degraded. A prior art discloses a technology of homogenizing a resistance of the lead line by adjusting a width (line width) of the lead line (for example, see Japanese Unexamined Patent Application Publication No. H08-076136).

SUMMARY

However, in the nowadays display device, a distance between adjacent lead lines is narrowed with high definition and miniaturization. Particularly, the lead line extends in a direction oblique to a direction in which the signal line extends, and the distance is further narrowed. Therefore, for example, the conventional technology has a problem that contact between adjacent wirings is generated when the lead line is widened and that disconnection is generated when the lead line is narrowed.

The present disclosure has been made in view of the above problem, and an object thereof is to improve the display quality in the display device by homogenizing the resistance of the lead line connected to a driving circuit.

In one general aspect, the instant application describes a driving circuit including an output circuit that outputs a signal to a lead line electrically connected to a signal line provided in a display panel; and an output transistor that is provided in the output circuit and connected to an output terminal of the output circuit. An on-resistance value of the output transistor is set according to a resistance value of the lead line electrically connected to the output transistor.

The above general aspect may include one or more of the following features.

The on-resistance value of the output transistor may be set so as to become smaller as a length of the lead line electrically connected to the output transistor is lengthened, and so as to become larger as the length of the lead line is shortened.

The output transistors are arrayed in a first direction in which a plurality of the signal lines electrically connected to the driving circuit are arranged. The on-resistance value of each of the plurality of the output transistors may be set so as to become smaller from a center of the driving circuit toward both end sides of the driving circuit in the first direction.

The on-resistance value of each of the plurality of the output transistors may be set so as to become smaller from the center of the driving circuit to both the end sides of the driving circuit in the first direction.

The plurality of the output transistors are provided with respect to each output circuit. The on-resistance value of each of the plurality of the output transistors connected to each output circuit may be set to a different value.

A first output transistor and a second output transistor may be connected in parallel to the output terminal of each output circuit. The second output transistor is set to an on-resistance value smaller than that of the first output transistor.

The on-resistance value of the output transistor may be set by adjusting a size of a channel portion of the output transistor.

The output transistor may output a gate-on voltage turning on a thin film transistor connected to a gate line in a pixel.

The driving circuit may further include a resistor that is electrically connected to an output terminal of at least one of the output circuits. A resistance value of the resistor may be set according to the resistance value of the lead line electrically connected to the resistor.

The resistors may be provided with respect to each of the plurality of the output circuits, and the resistance value of each of the resistors connected to each of the output circuits may be set to a different value.

A first resistor and a second resistor are connected in parallel to the output terminal of each of the output circuits. The second resistor may set to a resistance value smaller than that of the first resistor.

In another general aspect, the display device of the instant application includes an output circuit that outputs a signal to a lead line electrically connected to a signal line provided in a display panel; and an output transistor that is provided in the output circuit and connected to an output terminal of the output circuit. The output transistor includes a first output transistor and a second output transistor, in which on-resistance values are different from each other.

The above general aspect may include one or more of the following features.

The lead line may include a first lead line electrically connected to the first output transistor and a second lead line electrically connected to the second output transistor, the second lead line being longer than the first lead line. The on-resistance value of the first output transistor may be larger than the on-resistance value of the second output transistor.

The driving circuit may further include a resistor that is electrically connected to an output terminal of at least one of a plurality of the output circuits. The resistor may include a first resistor and a second resistor, in which resistance values are different from each other.

The first resistor may be electrically connected to the first output transistor and the first lead line. The second resistor may be electrically connected to the second output transistor and the second lead line. A resistance value of the first resistor may be larger than a resistance value of the second resistor.

In another general aspect, the display device of the instant application includes a display panel in which a plurality of signal lines and a plurality of lead lines electrically connected to the plurality of signal lines are provided; and a driving circuit including a plurality of output circuits that output a signal to the plurality of lead lines and output transistors that are provided in the output circuits and connected to output terminals of the output circuits. On-resistance values of the output transistors are set according to resistance values of the lead lines electrically connected to the output transistors.

The display device may further include a resistor that is electrically connected to an output terminal of at least one of the plurality of output circuits. A resistance value of the resistor may be set according to the resistance values of the lead lines electrically connected to the resistor.

A part of the plurality of lead lines may extend in a direction oblique to a direction in which the plurality of signal lines electrically connected to the driving circuit extend.

Each of the lead lines may be widened with decreasing length of the lead lines, and is narrowed with increasing length of the lead lines.

A width of the lead line connected onto a central side of the driving circuit may be larger than a width of the lead lines connected onto both end sides of the driving circuit.

In the configuration of the driving device of the present disclosure, the resistance of the lead line connected to a driving circuit can be homogenized, and thus improvement of the display quality can be achieved in the display device.

DETAILED DESCRIPTION

An embodiment of the present application is described below with reference to the drawings. The embodiment of the present application takes a liquid crystal display device as an example of a display device of the present application. However, the present application is not limited thereto. In the exemplary embodiment, a chip on glass (COG) type display device is cited as an example. However, the present disclosure is not limited to the COG type display device. For example, the display device may be a chip on film (COF) type, a tape carrier package (TCP) type display device, and the like.

Figure 1:
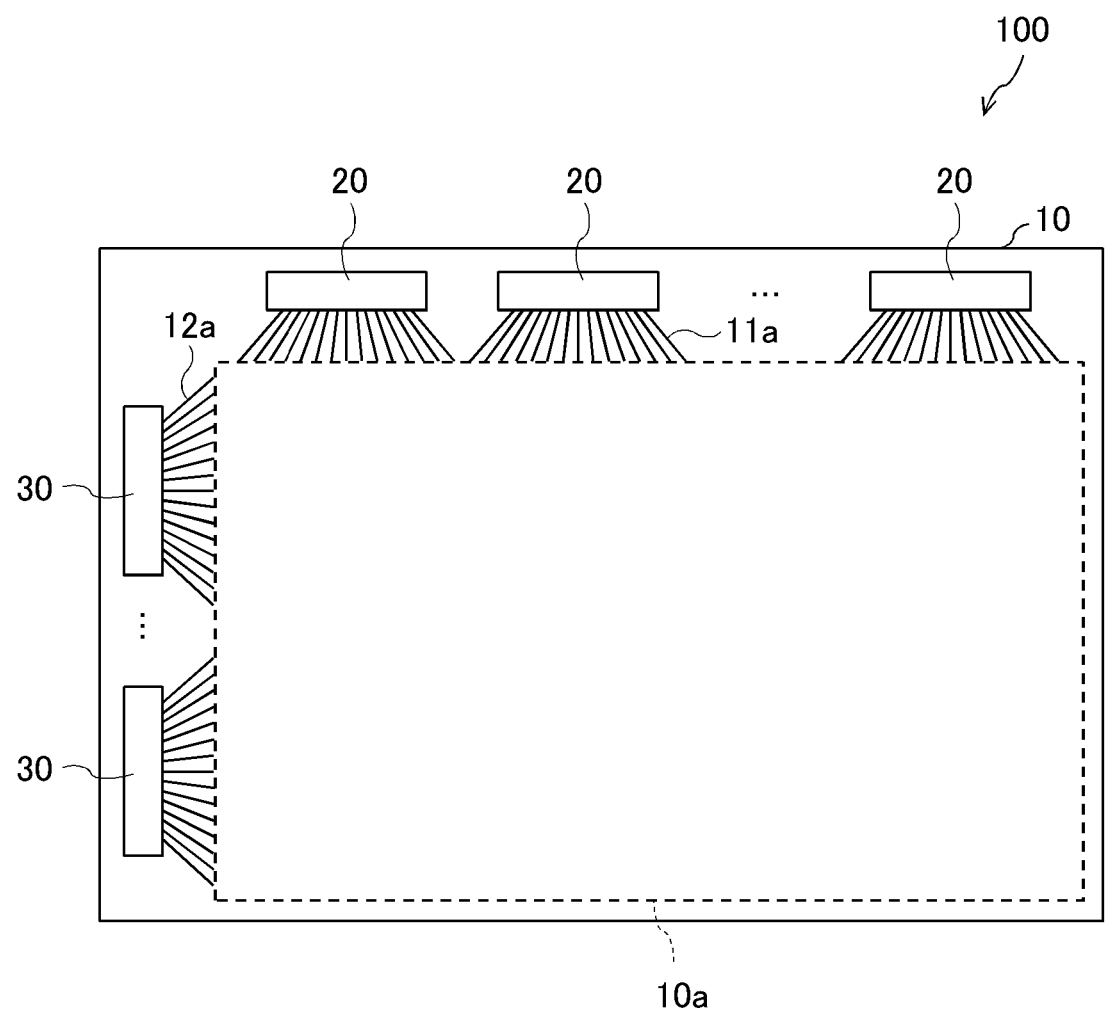
FIG. 1 is a plan view illustrating a schematic configuration of a liquid crystal display device according to an exemplary embodiment.
Figure 1:
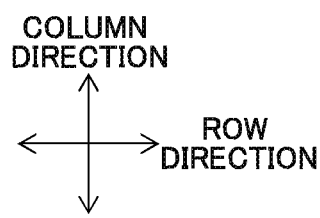

FIG. 1 is a plan view illustrating a schematic configuration of a liquid crystal display device according to an exemplary embodiment. Liquid crystal display device 100 includes display panel 10, a plurality of source driver ICs 20 (driving circuit), a plurality of gate driver ICs 30 (driving circuit), a control circuit (not illustrated), and a backlight device (not illustrated). There is no limitation on numbers of source driver ICs 20 and gate driver ICs 30. In FIG. 1, source driver ICs 20 and gate driver ICs 30 are individually arranged in line along two different sides (a left side and an upper side in FIG. 1) of display panel 10. Alternatively, source driver ICs 20 and gate driver ICs 30 may be arranged in line along one side. Display panel 10 includes display region 10a and a frame region around (outside) display region 10a. lead line 11a electrically connected to an output terminal of source driver IC 20 and lead line 12a electrically connected to an output terminal of gate driver IC 30 are provided in the frame region. A plurality of lead lines 11a are electrically connected to each source driver IC 20, and a plurality of lead lines 12a are electrically connected to each gate driver IC 30. Source driver IC 20 outputs a data signal (data voltage) to lead line 11a, and gate driver IC 30 outputs a gate signal (gate voltage) to lead line 12a.

Figure 2:
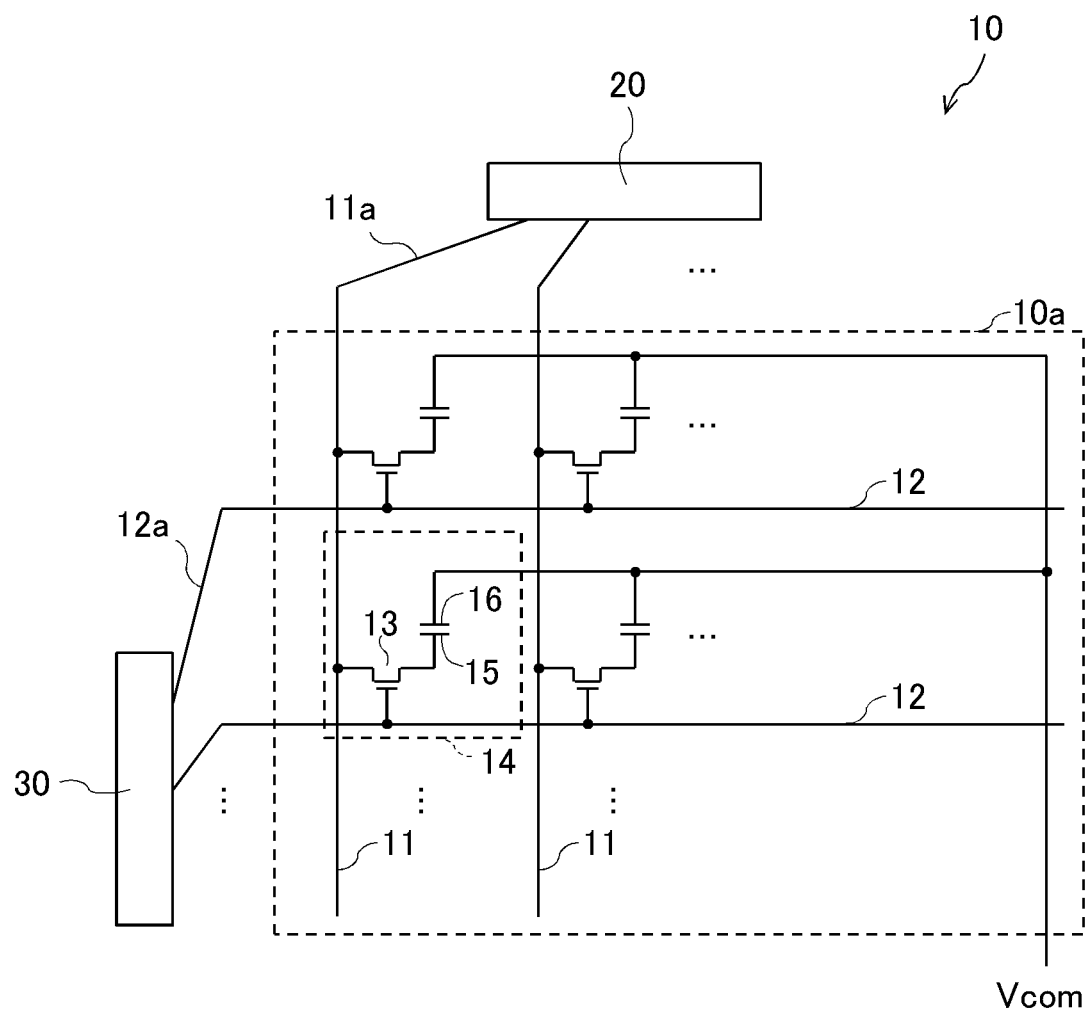
FIG. 2 is a plan view illustrating a schematic configuration of the liquid crystal display panel.

FIG. 2 is a plan view illustrating a schematic configuration of display panel 10. A plurality of data lines 11, which extend in a column direction and are arrayed at a predetermined pitch in a row direction, and a plurality of gate lines 12, which extend in the row direction and are arrayed at a predetermined pitch in the column direction, are provided in display region 10a of display panel 10. In the frame region, each data line 11 is electrically connected to each lead line 11a, and each gate line 12 is electrically connected to each lead line 12a. That is, each data line 11 is electrically connected to corresponding source driver IC 20 through each lead line 11a, and each gate line 12 is electrically connected to corresponding gate driver IC 30 through each lead line 12a.

An array pitch of the output terminal of source driver IC 20 is smaller than that of data line 11, and an array pitch of the output terminal of gate driver IC 30 is smaller than that of gate line 12. A part of the plurality of lead lines 11a extends in a direction oblique to the column direction, and a part of the plurality of lead lines 12a extends in a direction oblique to the row direction. Therefore, a length of each of lead lines 11a, 12a varies depending on a place.

Thin film transistor (TFT) 13 is provided in an intersection of each data line 11 and each gate line 12. In display panel 10, a plurality of pixels 14 are arrayed into a matrix shape (the row direction and the column direction) corresponding to the intersections of data lines 11 and gate lines 12. Although not illustrated, display panel 10 includes a thin film transistor substrate (TFT substrate), a color filter substrate (CF substrate), and a liquid crystal layer sandwiched between the TFT substrate and the CF substrate. A plurality of pixel electrodes 15 corresponding to respective pixels 14 and common electrodes 16 common to respective pixels 14 are provided in the TFT substrate. Common electrode 16 may be provided in the CF substrate.

A data signal (data voltage) is supplied from corresponding source driver IC 20 to each data line 11 through lead line 11a. A gate signal (gate voltage) is supplied from corresponding gate driver IC 30 to each gate line 12 through lead line 12a. Common voltage Vcom is supplied from a common driver (not illustrated) to common electrode 16 through a common wiring. When an on-voltage (gate-on voltage) of the gate signal is supplied to gate line 12, thin film transistor 13 connected to gate line 12 is turned on, and the data voltage is supplied to pixel electrode 15 through data line 11 connected to thin film transistor 13. An electric field is generated by a difference between the data voltage supplied to pixel electrode 15 and common voltage Vcom supplied to common electrode 16. The liquid crystal is driven by the electric field, and transmittance of light emitted from a backlight is controlled, and thus displaying an image. For performing color display, a desired data voltage is supplied to data line 11 connected to pixel electrode 15 of pixel 14 corresponding to each of red, green, and blue, which are formed by a stripe color filter.

Figure 3A:
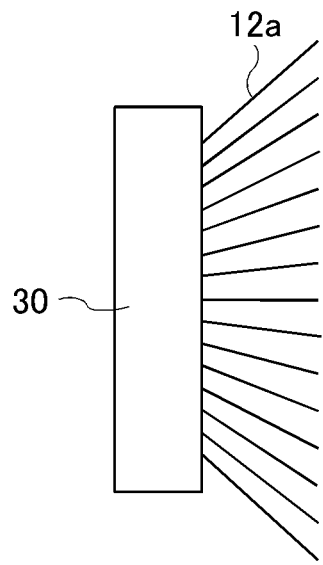
FIG. 3A illustrates a configuration in which lead lines are disposed such that the lengths of lead lines become vertically symmetric.
Figure 3B:
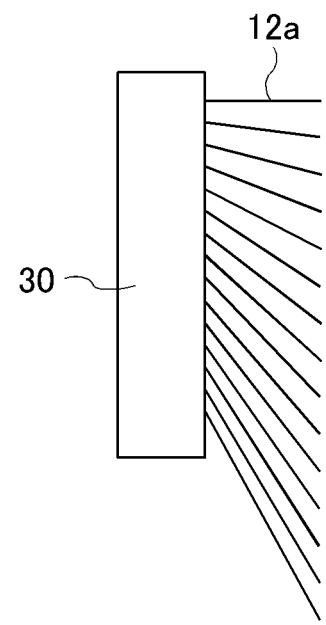
FIG. 3B illustrates a configuration in which lead lines are disposed such that the lengths of lead lines become vertically asymmetric.

A resistance (wiring resistance) of the lead line will be discussed. Lead line 12a connected to gate driver IC 30 is cited an example. As described above, because the array pitch of the output terminal of gate driver IC 30 is smaller than that of gate line 12, a length of lead line 12a varies depending on a place of the output terminal of gate driver IC 30 connected to lead line 12a. For example, as illustrated in FIG. 3A, lead line 12a connected to the output terminal disposed on a central side of gate driver IC 30 is short, and lead line 12a connected to the output terminal disposed on both end sides of gate driver IC 30 is long. FIG. 3A illustrates a configuration in which lead lines 12a are disposed such that the lengths of lead lines 12a become vertically symmetric. Alternatively, a configuration may be made in which lead lines 12a are disposed such that the lengths of lead lines 12a become vertically asymmetric as illustrated in FIG. 3B. In FIG. 3B, lead line 12a connected to the output terminal disposed on one end side (an upper end side in FIG. 3B) of gate driver IC 30 is short, and lead line 12a connected to the output terminal disposed on the other end side (a lower end side in FIG. 3B) of gate driver IC 30 is long. Therefore, a resistance of lead line 12a varies depending on a place where lead line 12a is disposed.

Figure 4:
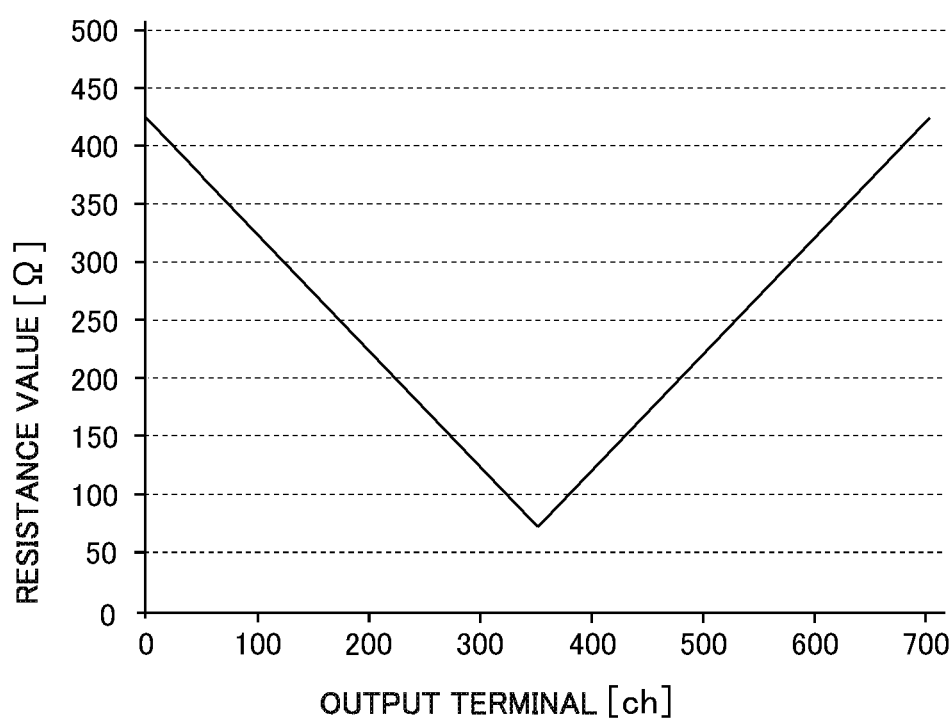
FIG. 4 is a graph illustrating a simulation result of a resistance distribution of lead lines in FIG. 3A.

FIG. 4 is a graph illustrating a simulation result of a resistance distribution of lead line 12a in FIG. 3A. A horizontal axis of the graph in FIG. 4 indicates a number (ch) of the output terminal of gate driver IC 30, and a vertical axis indicates a resistance value (Ω) of lead line 12a. The resistance value in FIG. 4 indicates a unique resistance value corresponding to characteristics (such as a length and a width) of lead line 12a. Here, 0 ch of the horizontal axis indicates the output terminal at one end (an upper end in FIG. 3A) of gate driver IC 30, 350 ch indicates the output terminal in the center of gate driver IC 30, and 700 ch indicates the output terminal at the other end (a lower end in FIG. 3A) of gate driver IC 30. As can be seen from FIG. 4, lead line 12a connected to the output terminal in the center of gate driver IC 30 has the minimum resistance, and the resistance of lead line 12a increases linearly from the center toward the output terminal at the end. The resistance difference appears as the luminance difference of the display panel, and leads to the degradation of the display quality.

In liquid crystal display device 100 of the exemplary embodiment, a driver IC (source driver IC, gate driver IC) particularly includes a configuration that reduces the resistance difference (homogenizes the resistance value). Details of the configuration will be described below. Although gate driver IC 30 will be described below by way of example, the same holds true for source driver IC 20.

Figure 5:
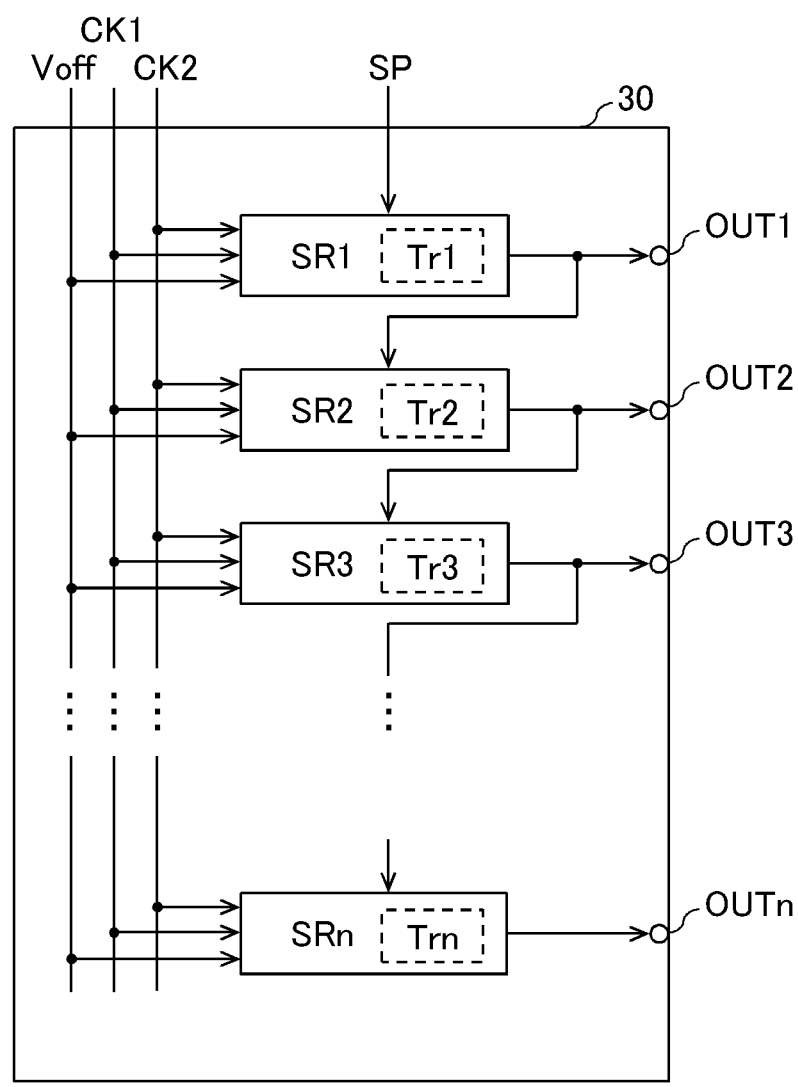
FIG. 5 is a view illustrating a configuration of a gate driver IC.

FIG. 5 is a view illustrating a configuration of gate driver IC 30. Gate driver IC 30 includes a plurality of shift register circuits SR1 to SRn. Gate driver IC 30 corresponding to the graph in FIG. 4 includes 700 shift register circuits SR1 to SR700 (n=700). Clocks CK1, CK2 and gate-off voltage Voff are input to each shift register circuit SR. Start pulse SP is input to first-stage shift register circuit SR1, and an output signal of preceding-stage shift register circuit SR is input to shift register circuits SR from second and following stages. The output signal of shift register circuit SR1 to SRn is sequentially output from output terminal OUT1 to OUTn to gate line 12.

Figure 6:
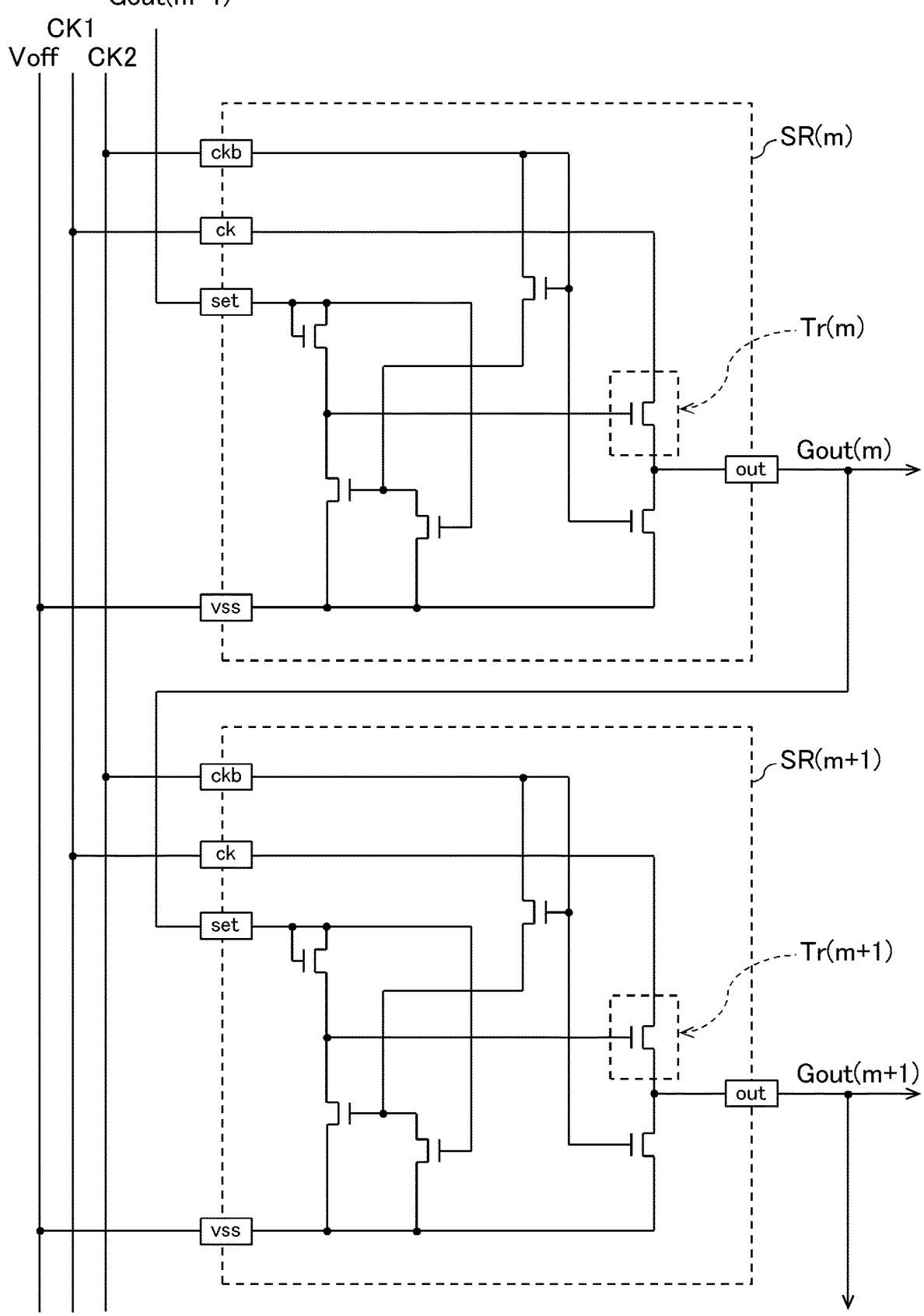
FIG. 6 is a circuit diagram illustrating a configuration example of a shift register circuit.

Each shift register circuit SR is constructed with a plurality of transistors including an output transistor Tr that outputs a gate-on voltage to turn on thin film transistor 13 (see FIG. 2) of pixel 14. FIG. 6 is a circuit diagram illustrating a configuration example of shift register circuit SR. FIG. 6 illustrates m (m is an integer of 1 to n)-stage shift register circuit SR(m) and (m+1)-stage shift register circuit SR(m+1). Shift register circuit SR includes a pair of clock terminals ck, ckb, reset terminal vss, input terminal set, and output terminal out. Clock lines are connected to clock terminals ck, ckb, and clocks CK1, CK2 having phases opposite to each other are input to clock terminals ck, ckb. An off-signal line is connected to reset terminal vss, and gate-off voltage Voff (reset signal) is input to reset terminal vss to turn off thin film transistor 13.

Output signal Gout(m−1) output from preceding-stage shift register circuit SR(m−1) is input to input terminal set of shift register circuit SR(m). When output signal Gout(m−1) is input to input terminal set while clocks CK1, CK2 are input to clock terminals ck, ckb, shift register circuit SR(m) outputs a pulse signal corresponding to clock CK1 as output signal Gout(m) from output terminal out to gate line 12 and subsequent-stage shift register circuit SR(m+1) through output transistor Tr(m).

The resistance value (on-resistance value) in an on state of each output transistor Tr is set to a different value depending on the place where output transistor Tr is disposed in gate driver IC 30. For example, the on-resistance value of output transistor Tr is set so as to be the largest in output transistor Tr electrically connected to output terminal OUT in the center of gate driver IC 30, and so as to be the smallest in output transistor Tr electrically connected to output terminal OUT at the end of gate driver IC 30. For example, the on-resistance value of output transistor Tr is set by adjusting a size (channel width) of a channel portion.

Figure 7:
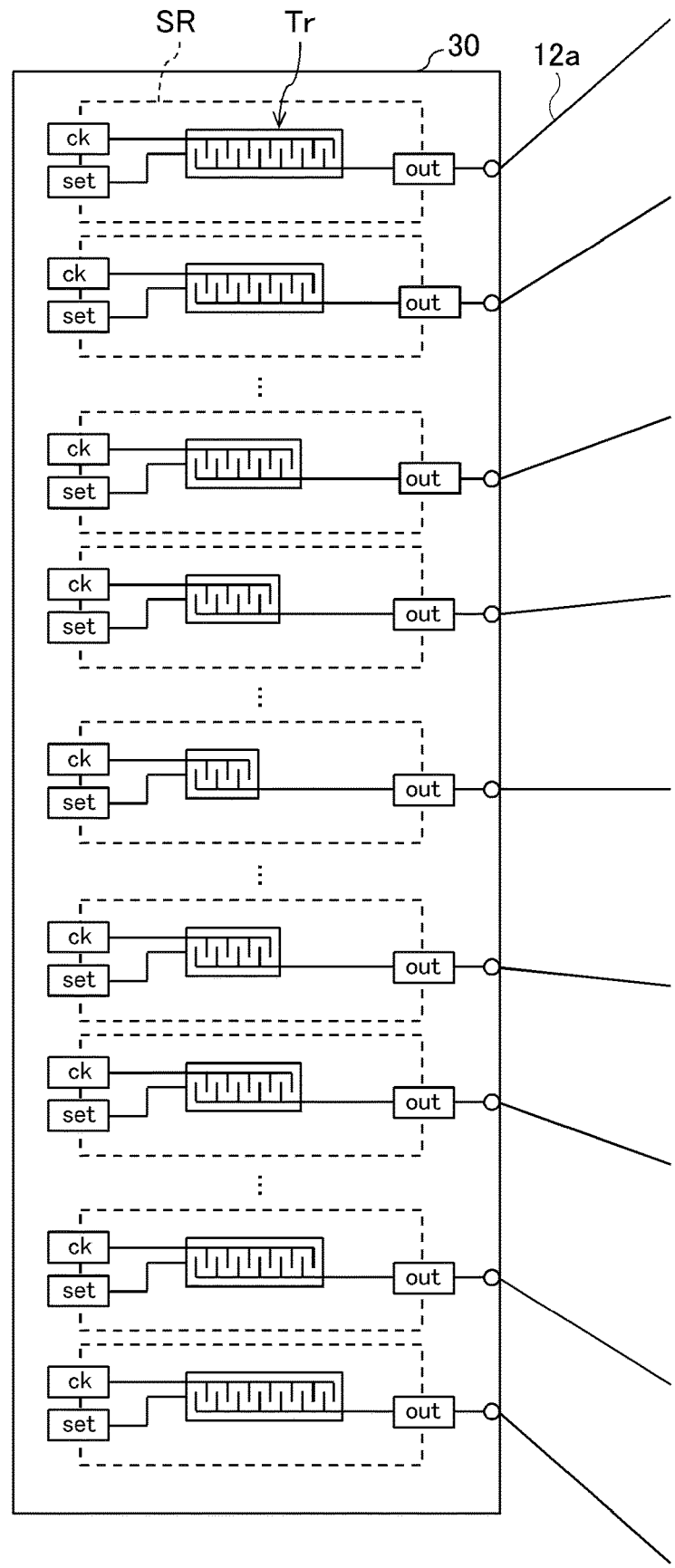
FIG. 7 is a plan view schematically illustrating a configuration example of output transistor of the gate driver IC.

FIG. 7 is a plan view schematically illustrating a configuration example of output transistor Tr in gate driver IC 30. As illustrated in FIG. 7, the channel width of output transistor Tr is set so as to be the smallest in output transistor Tr electrically connected to output terminal OUT in the center of gate driver IC 30, and so as to be the largest in output transistor Tr electrically connected to output terminal OUT at the end of gate driver IC 30.

Figure 8:
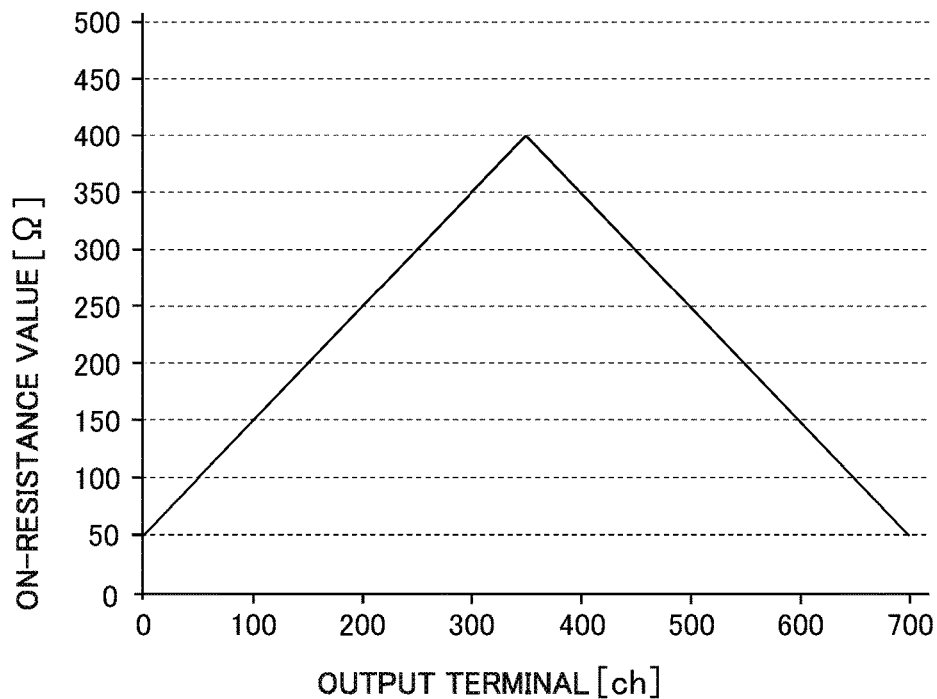
FIG. 8 is a graph illustrating a distribution of an on-resistance value of output transistor, which corresponds to the resistance distribution of lead lines in FIG. 4.

FIG. 8 is a graph illustrating a distribution of an on-resistance value of output transistor Tr, which corresponds to the resistance distribution of lead line 12a in FIG. 4. As illustrated in FIG. 8, the on-resistance value is set so as to be the largest in output transistor Tr electrically connected to output terminal OUT (350 ch) in the center of gate driver IC 30, and so as to become smaller toward output transistor Tr electrically connected to output terminal OUT (0 ch, 700 ch) at the end of gate driver IC 30 from the center of gate driver IC 30. In FIG. 8, the on-resistance value changes linearly. However, the on-resistance value is not limited to the linear change.

Figure 9:
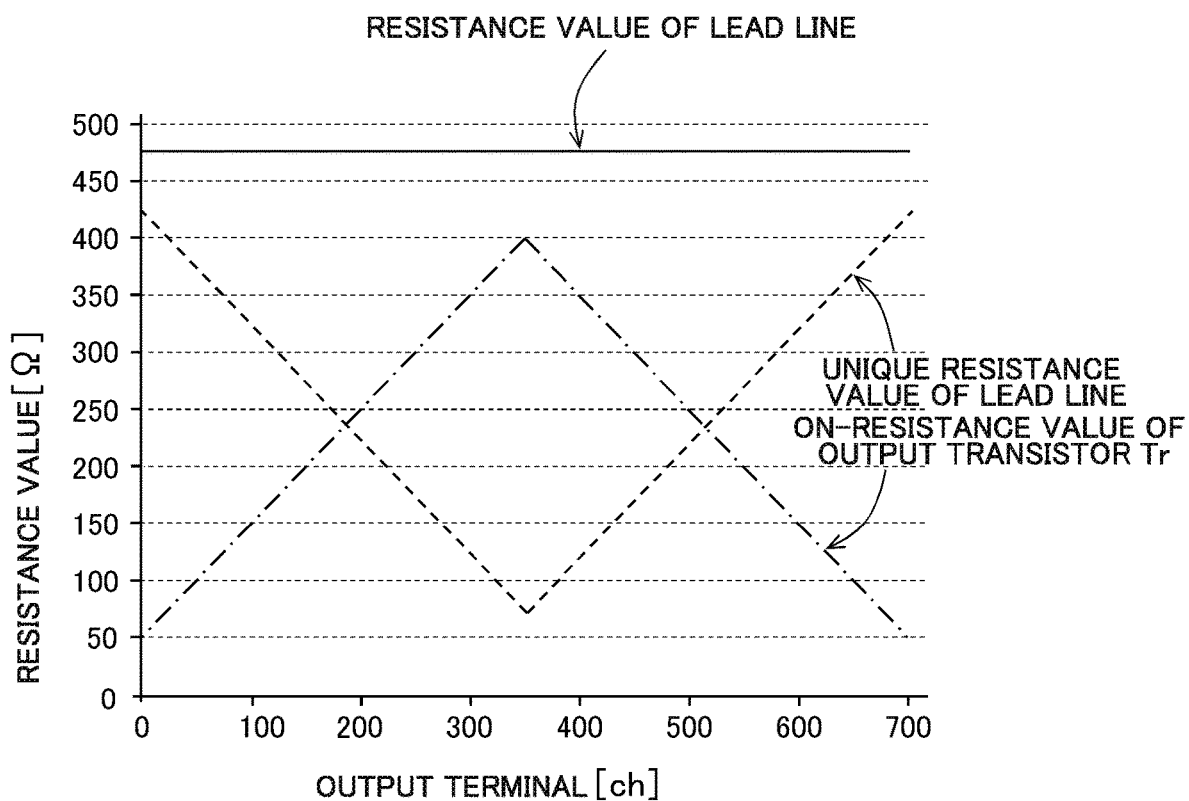
FIG. 9 is a graph illustrating a distribution of resistance value of each lead line.

According to the above configuration, the unique resistance value (see FIG. 4) of the lead line and the on-resistance value (see FIG. 8) of output transistor Tr are combined to homogenize the resistance value of each lead line as illustrated in FIG. 9. Therefore, the luminance difference is reduced, so that the degradation of the display quality due to the wiring resistance can be prevented. It is not necessary to adjust the width of the lead line, so that contact between the lead lines or disconnection can be prevented, and an area of the frame region can be reduced. The configuration of shift register circuit SR is not limited to the configuration in FIG. 6, but a known configuration can be adopted to the configuration of each unit except for output transistor Tr.

Figure 10:
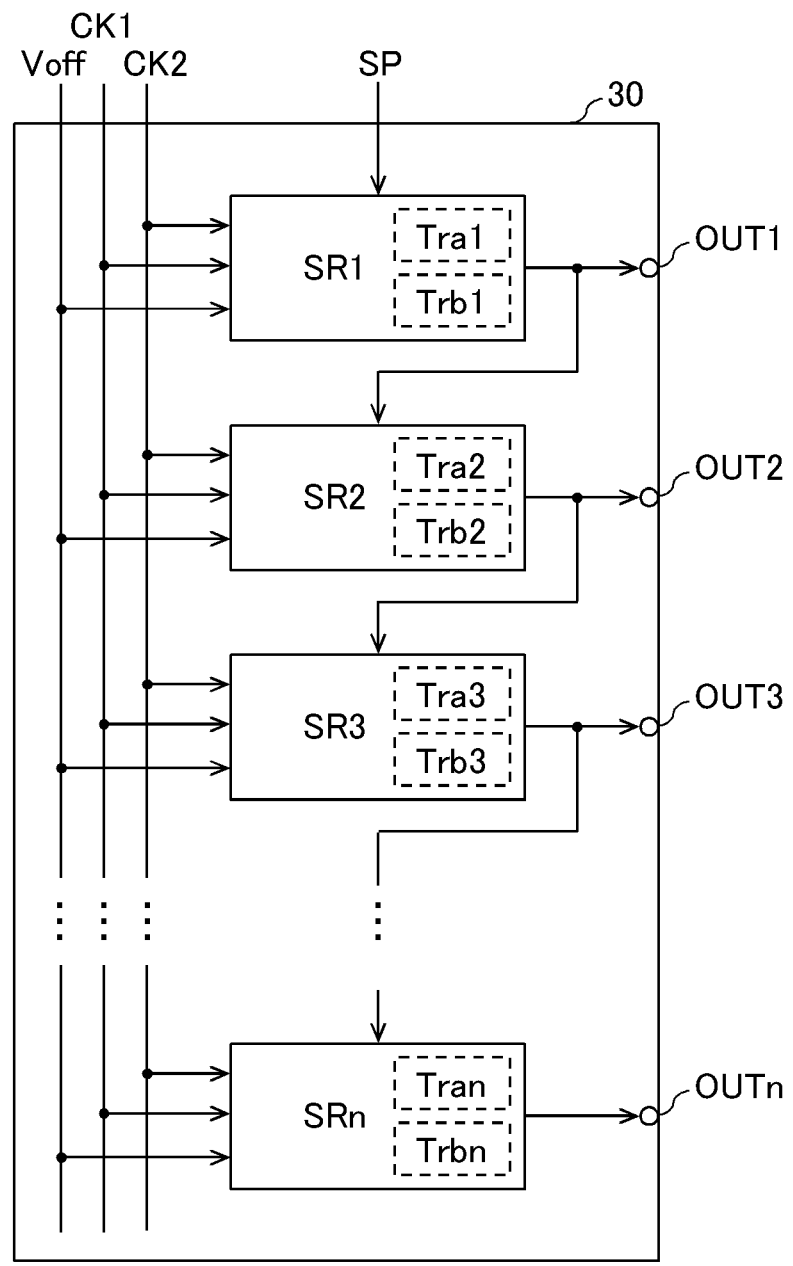
FIG. 10 is a view illustrating another configuration of the gate driver IC.

The configuration of gate driver IC 30 is not limited to the configuration in FIG. 5. FIG. 10 is a view illustrating another configuration of gate driver IC 30. The description of the same configuration as the configuration in FIG. 5 will be omitted below.

Gate driver IC 30 includes a plurality of shift register circuits SR1 to SRn. Each shift register circuit SR includes first output transistor Tra and second output transistor Trb, which are connected in parallel to each other.

Figure 11:
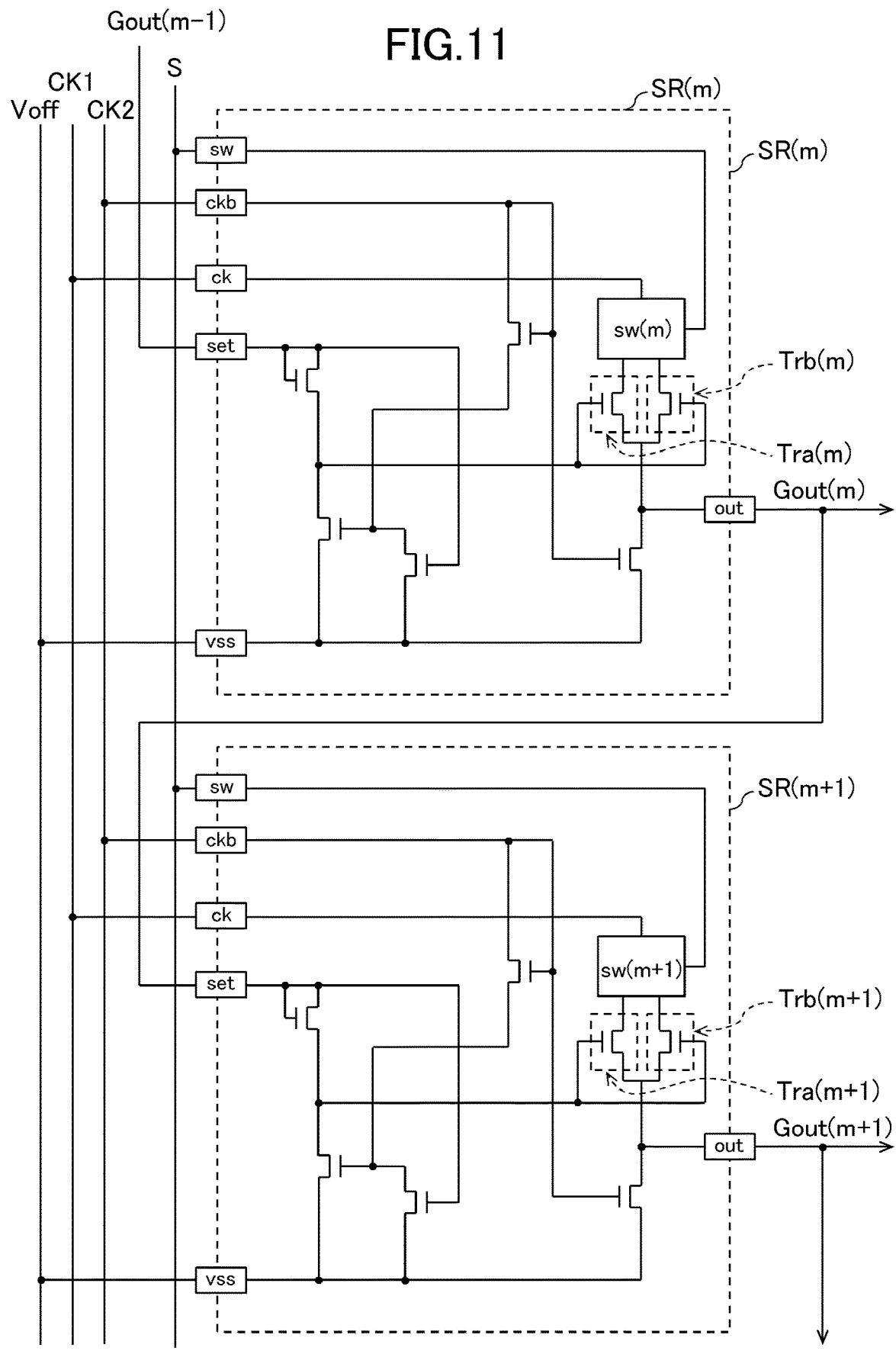
FIG. 11 is a circuit diagram illustrating a specific configuration example of shift register circuits in FIG. 10.

FIG. 11 is a circuit diagram illustrating a specific configuration example of shift register circuit SR in FIG. 10. One end of each of first output transistor Tra and second output transistor Trb is connected to switch circuit sw, and the other end is connected to output terminal out. Switch signal S is input to switch circuit sw. For example, when first switch signal S is input to switch circuit sw, output signal Gout(m) is output through first output transistor Tra. When second switch signal S is input to switch circuit sw, output signal Gout(m) is output through second output transistor Trb. When third switch signal S is input to switch circuit sw, output signal Gout(m) is output through first output transistor Tra and second output transistor Trb, which are connected in parallel. A known configuration can be adopted to switch circuit sw.

The on-resistance value of each first output transistor Tra is set to a different value depending on the place where first output transistor Tra is disposed in gate driver IC 30, and the on-resistance value of each second output transistor Trb is set to a different value depending on the place where second output transistor Trb is disposed in gate driver IC 30. For example, for a plurality of first output transistors Tra, the on-resistance value is set so as to be the largest in first output transistor Tra electrically connected to output terminal OUT in the center of gate driver IC 30, and so as to be the smallest in first output transistor Tra electrically connected to output terminal OUT at the end of gate driver IC 30. Similarly, for a plurality of second output transistors Trb, the on-resistance value is set so as to be the largest in second output transistor Trb electrically connected to output terminal OUT in the center of gate driver IC 30, and so as to be the smallest in second output transistor Trb electrically connected to output terminal OUT at the end of gate driver IC 30.

Figure 12:
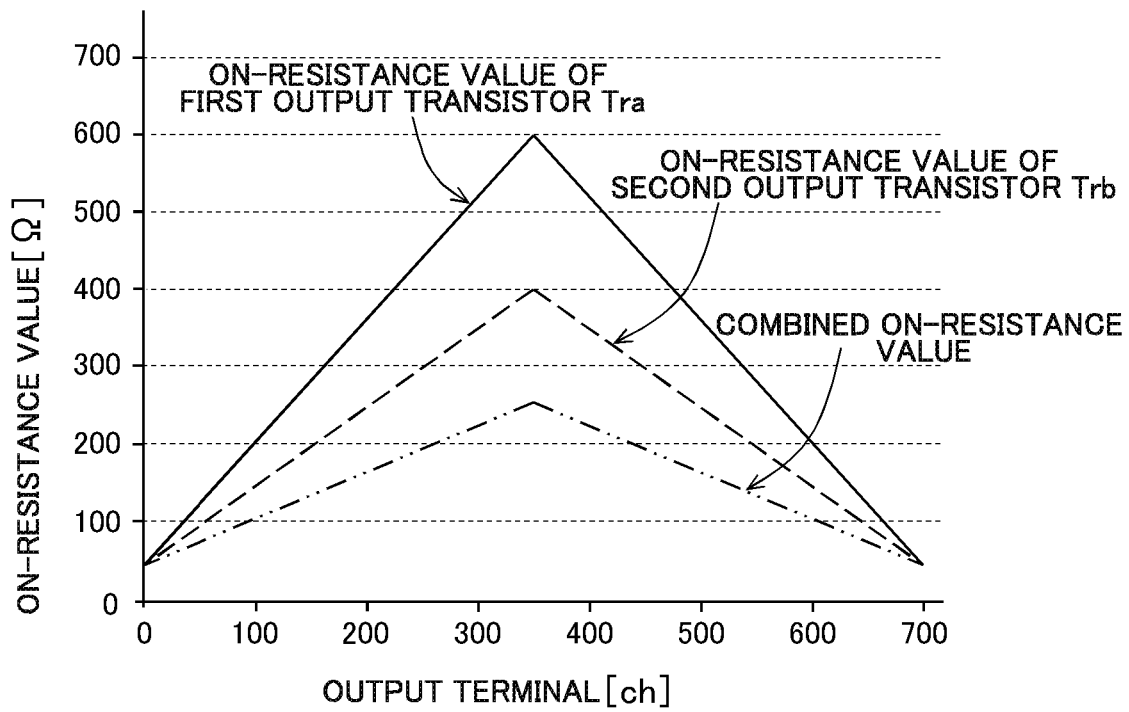
FIG. 12 is a graph illustrating a distribution of on-resistance value set to a first output transistor and a second output transistor.

The on-resistance values of first output transistor Tra and second output transistor Trb are set to different values. FIG. 12 is a graph illustrating a distribution of the on-resistance value set to first output transistor Tra and second output transistor Trb. As illustrated in FIG. 12, for first output transistor Tra and second output transistor Trb, the on-resistance value is set so as to be the largest in output transistor Tr electrically connected to output terminal OUT in the center of gate driver IC 30, and so as to become smaller toward output transistor Tr electrically connected to output terminal OUT at the end of gate driver IC 30 from the center of gate driver IC 30. The on-resistance value of second output transistor Trb is set so as to become smaller than the on-resistance value of first output transistor Tra. FIG. 12 illustrates a resistance value (combined on-resistance value) in which the on-resistance values of first output transistor Tra and second output transistor Trb, which are connected in parallel, are combined. Each resistance distribution in FIG. 12 has a different functional characteristic (in this case, linearity).

Figure 13:
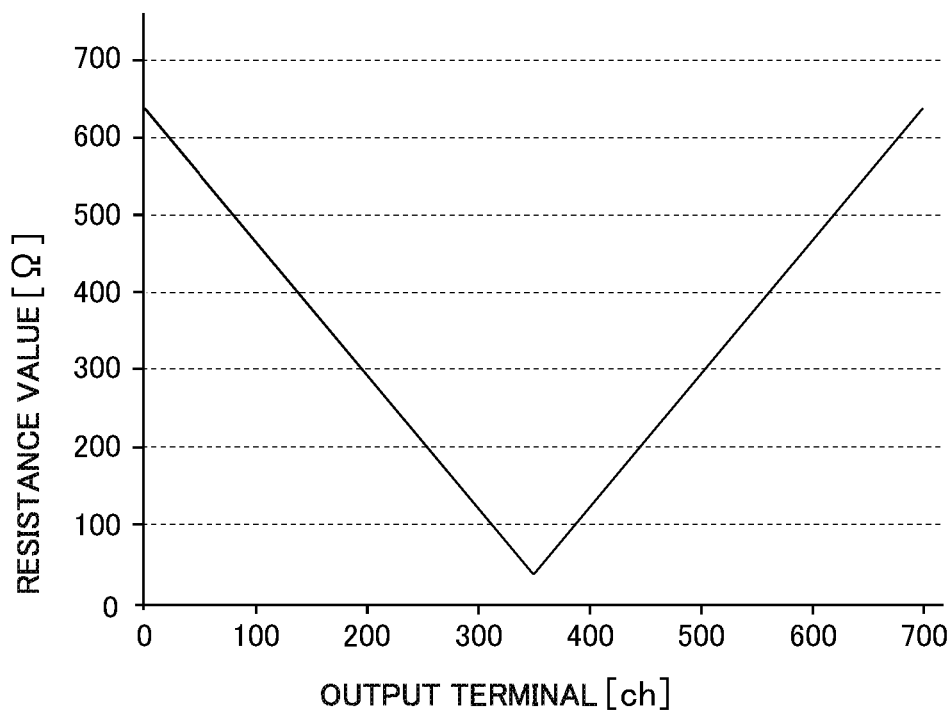
FIG. 13 is a graph illustrating a distribution of resistance value of lead lines.
Figure 14:
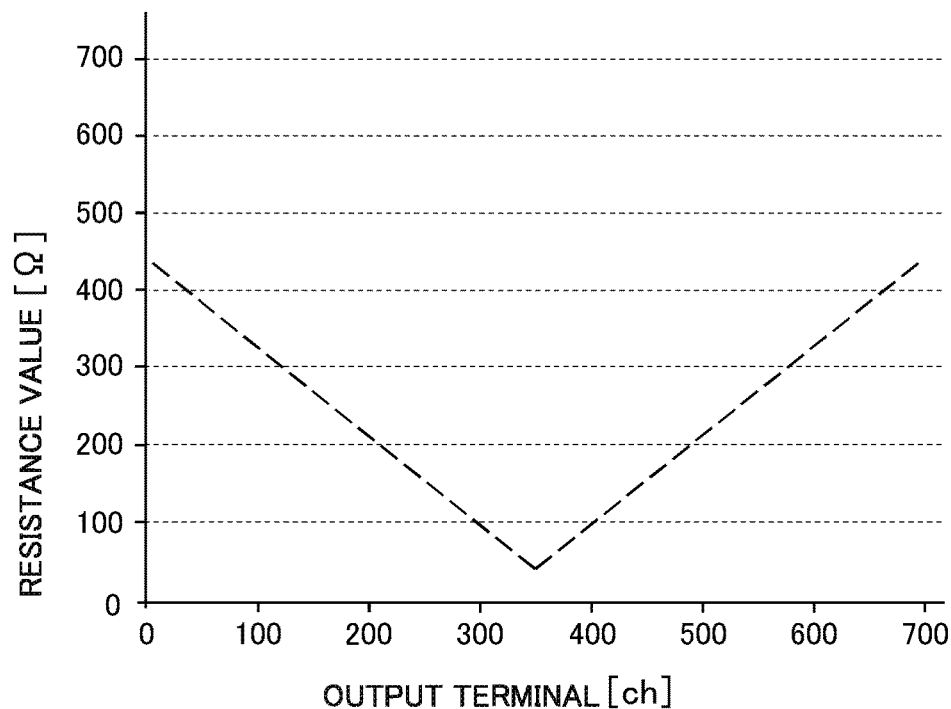
FIG. 14 is a graph illustrating a distribution of resistance value of lead lines.
Figure 15:
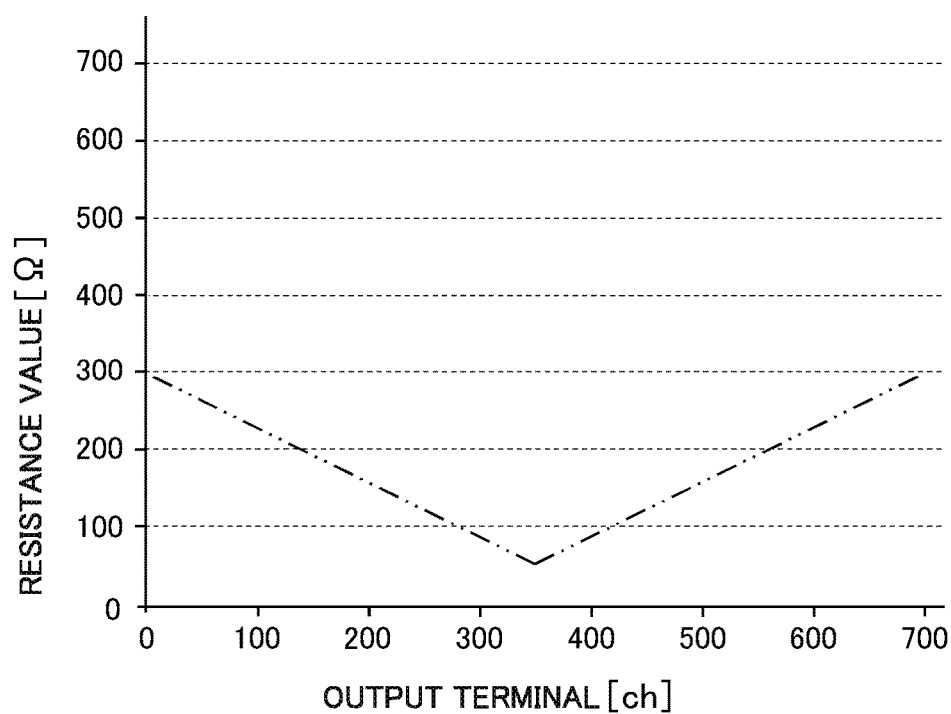
FIG. 15 is a graph illustrating a distribution of resistance value of lead lines.

In the above configuration, resistance distributions of three patterns can be set by one gate driver IC 30. For example, for display panel 10 in which lead line 12a has a resistance distribution in FIG. 13, the connection (first pattern) is established such that output signal Gout(m) is output through first output transistor Tra, which allows the homogenization of the resistance value of each lead line 12a. For example, for display panel 10 in which lead line 12a has a resistance distribution in FIG. 14, the connection (second pattern) is established such that output signal Gout(m) is output through second output transistor Trb, which allows the homogenization of the resistance value of each lead line 12a. For example, for display panel 10 in which lead line 12a has a resistance distribution in FIG. 15, the parallel connection (third pattern) is established such that output signal Gout(m) is output through first output transistor Tra and second output transistor Trb, which allows the homogenization of the resistance value of each lead line 12a.

Thus, the first to third patterns are switched by switch circuit SW according to a kind (such as a size and resolution) of display panel 10. Therefore, the resistance value of each lead line 12a can be homogenized according to the kind of display panel 10.

The configurations of shift register circuit SR and output transistor Tr can also be adopted to source driver IC 20.

Figure 16:
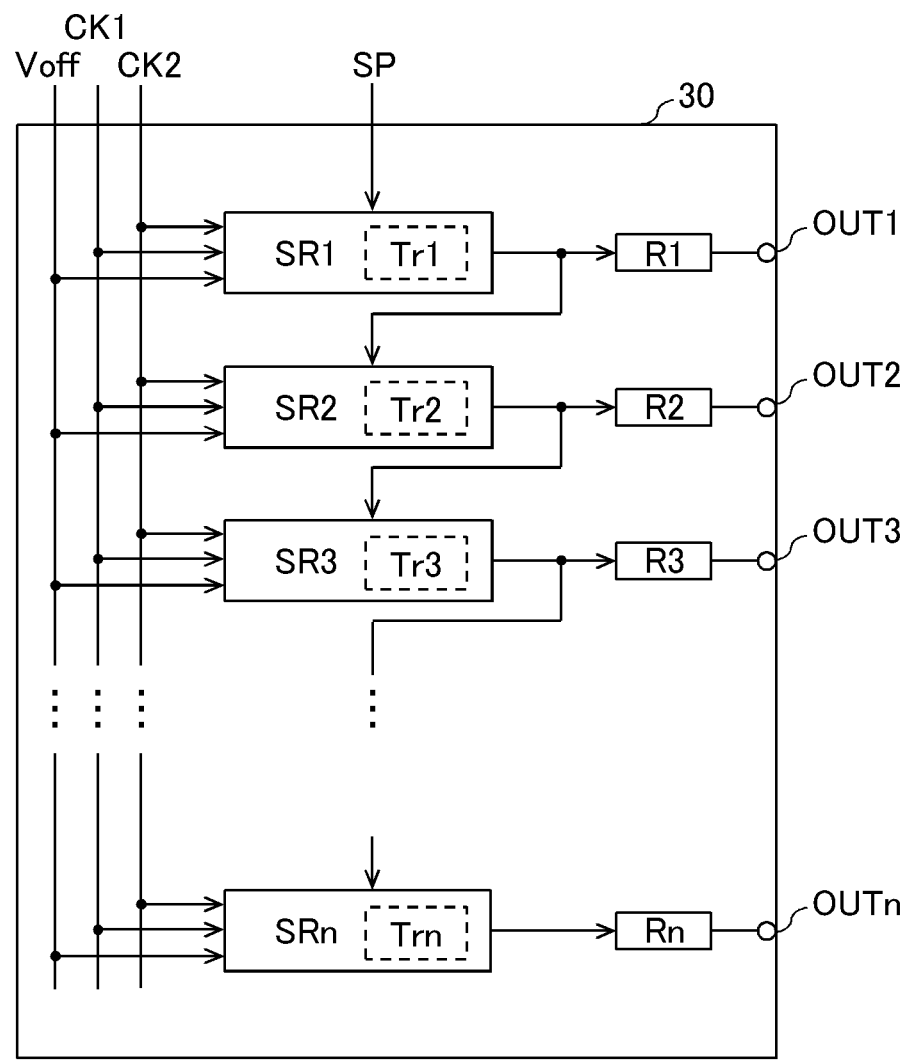
FIG. 16 is a view illustrating another configuration of the gate driver IC.

The present disclosure is not limited to the exemplary embodiment. FIG. 16 is a view illustrating another configuration of gate driver IC 30. Shift register circuit SR has the same configuration as that in FIGS. 5 and 6. Shift register circuit SR may have the configuration in FIGS. 10 and 11. In gate driver IC 30 of FIG. 16, the output terminal of each shift register circuit SR is connected to one end (input terminal) of resistor R. The other end (output terminal) of resistor R is connected to output terminal OUT of gate driver IC 30.

Figure 17:
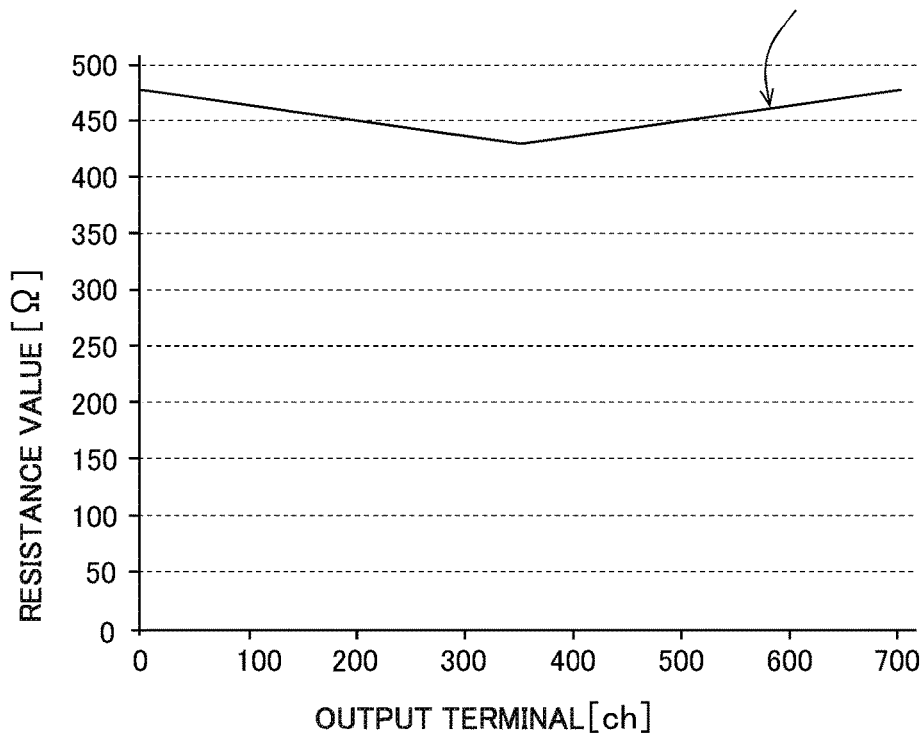
FIG. 17 is a graph illustrating a distribution of resistance value of lead lines.
Figure 18:
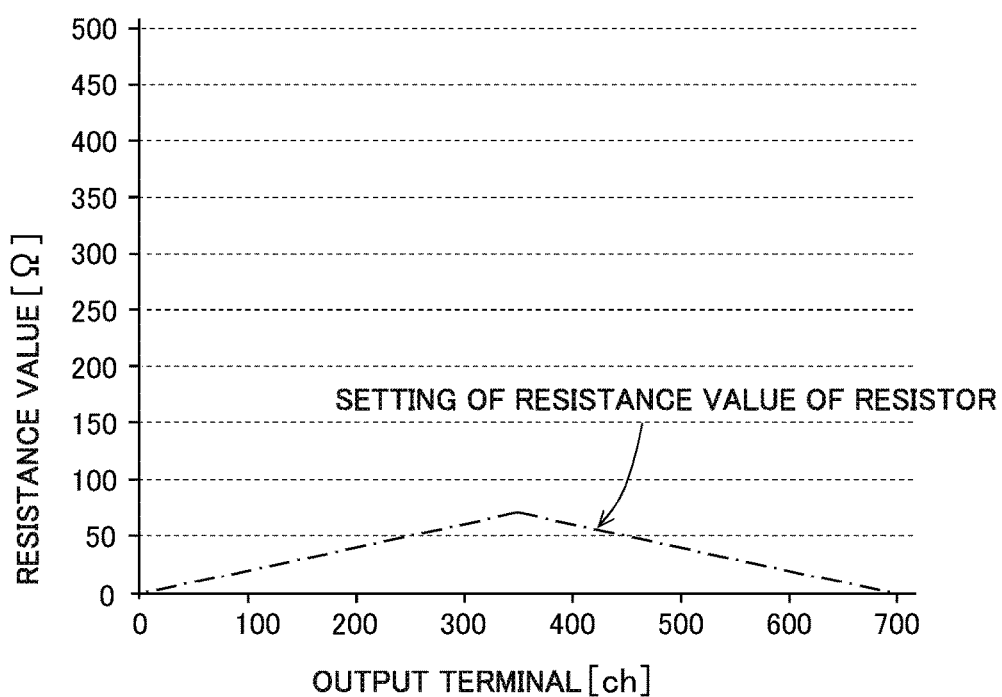
FIG. 18 is a graph illustrating a distribution of resistance value set in a resistor.

The resistance value of each resistor R is set to a different value depending on the place where resistor R is disposed in gate driver IC 30. For example, the resistance value of resistor R is set so as to be the largest in resistor R connected to output terminal OUT in the center of gate driver IC 30, and so as to be the smallest in resistor R connected to output terminal OUT at the end of gate driver IC 30. For example, in the case where the resistance distribution of lead line 12a becomes a state in FIG. 17 as a result of the setting of the on-resistance value by output transistor Tr of shift register circuit SR, the resistance value of resistor R is set as illustrated by a resistance distribution in FIG. 18. That is, the resistance value is set so as to be the largest in resistor R connected to output terminal OUT(350 ch) in the center of gate driver IC 30, and so as to become smaller toward resistor R connected to output terminal OUT(0 ch, 700 ch) at the end of gate driver IC 30 from the center of gate driver IC 30. In FIG. 18, the resistance value changes linearly. However, the resistance value is not limited to the linear change.

Figure 19:
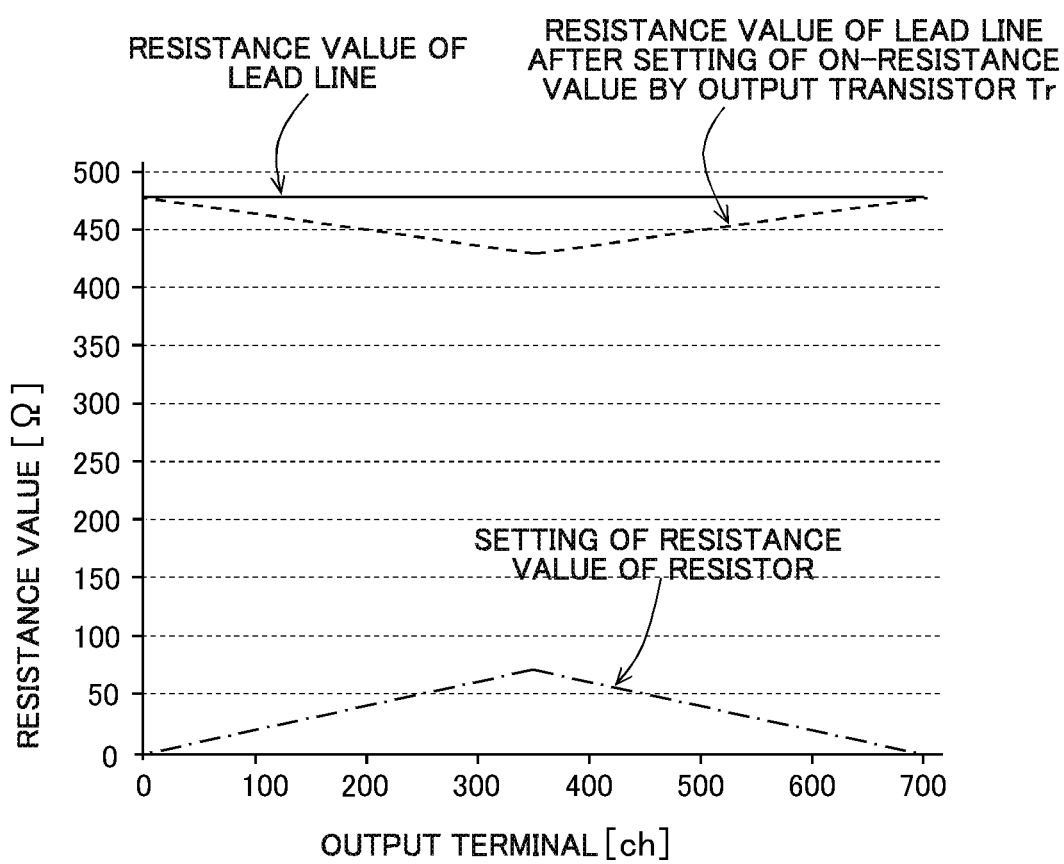
FIG. 19 is a graph illustrating a distribution of resistance value of lead lines.

In the above configuration, as illustrated in FIG. 19, the resistance value of each lead line can be homogenized by the setting of the on-resistance value by output transistor Tr of shift register circuit SR and the setting of the resistance value of resistor R. Therefore, the luminance difference is reduced, so that the degradation of the display quality due to the wiring resistance can be prevented.

Figure 20:
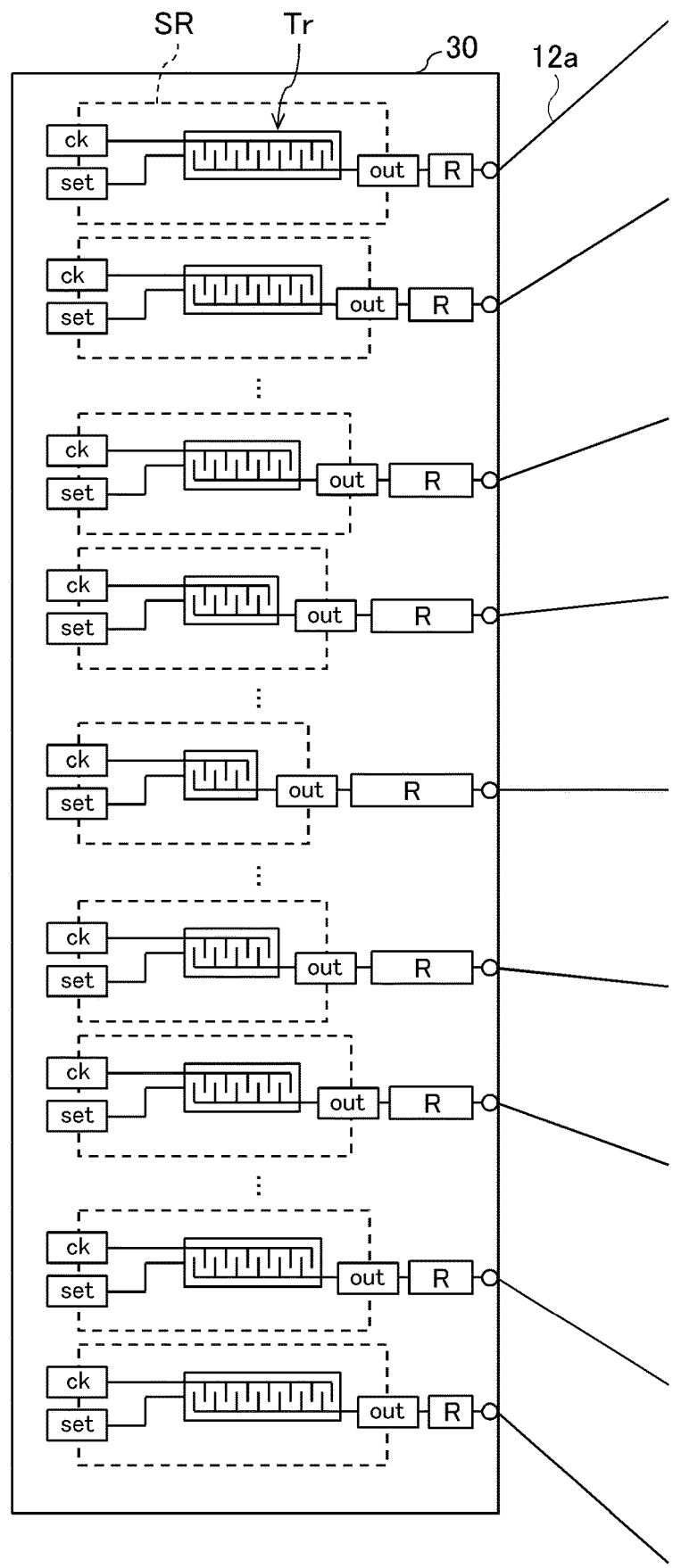
FIG. 20 is a plan view schematically illustrating a configuration example of output transistors and resistors of the gate driver IC.

In the above configuration, because an inversely proportional relationship holds between a size of output transistor Tr and a size of resistor R in gate driver IC 30, resistor R having a large size (high resistance) can be disposed in a region adjacent to shift register circuit SR including small-size output transistor Tr, and resistor R having a small size (low resistance) can be disposed in a region adjacent to shift register circuit SR including large-size output transistor Tr as illustrated in FIG. 20. Therefore, shift register circuit SR and resistor R are efficiently disposed, and thus the size of gate driver IC 30 can be suppressed to the minimum size.

Figure 21:
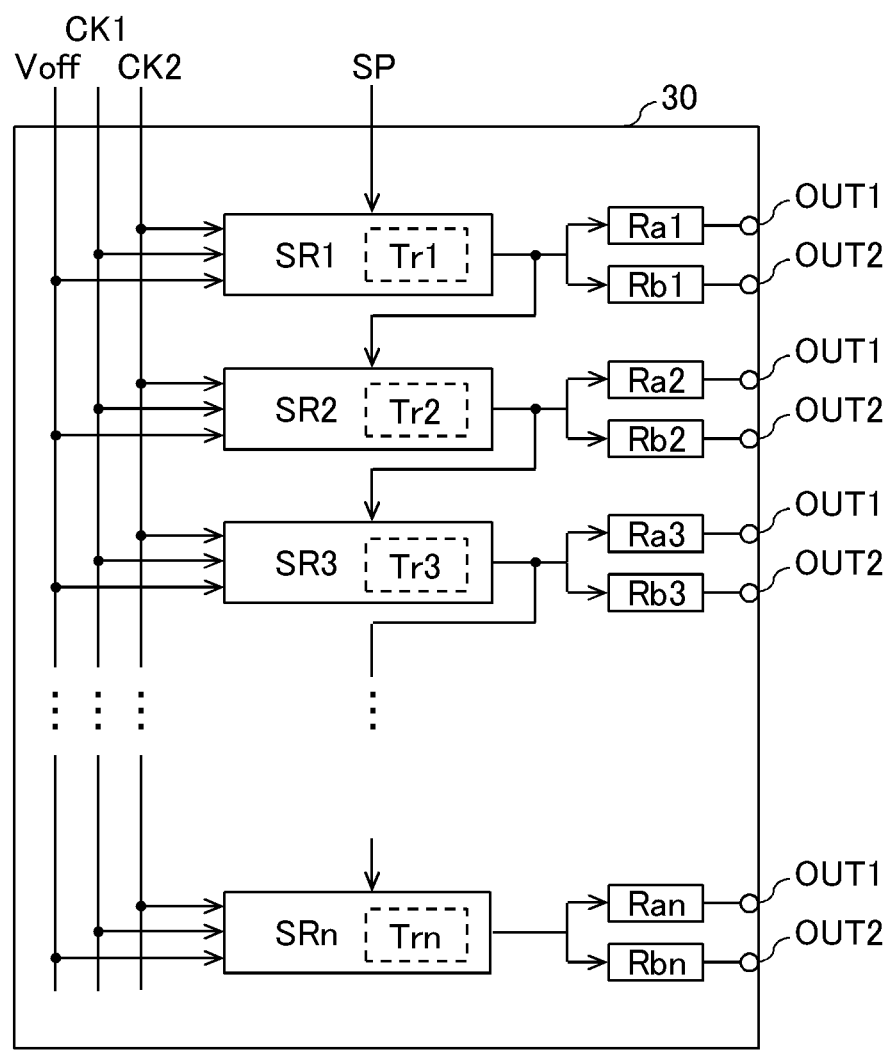
FIG. 21 is a view illustrating another configuration of the gate driver IC.

FIG. 21 is a view illustrating still another configuration of gate driver IC 30. In gate driver IC 30 of FIG. 21, the output terminal of each shift register circuit SR is connected to one end (input terminal) of each of first resistor Ra and second resistor Rb, which are connected in parallel to each other. The other end (output terminal) of first resistor Ra is connected to first output terminal OUT1 of gate driver IC 30, and the other end (output terminal) of second resistor Rb is connected to second output terminal OUT2 of gate driver IC 30. The output signal of each-stage shift register circuit SR is input to each-stage first resistor Ra and second resistor Rb.

The resistance value of each first resistor Ra is set to a different value depending on the place where first resistor Ra is disposed in gate driver IC 30, and the resistance value of each second resistor Rb is set to a different value depending on the place where second resistor Rb is disposed in gate driver IC 30. For example, for the plurality of first resistors Ra, the resistance value is set so as to be the largest in first resistor Ra connected to output terminal OUT in the center of gate driver IC 30, and so as to be the smallest in first resistor Ra connected to output terminal OUT at the end of gate driver IC 30. Similarly, for the plurality of second resistors Rb, the resistance value is set so as to be the largest in second resistor Rb connected to output terminal OUT in the center of gate driver IC 30, and so as to be the smallest in second resistor Rb connected to output terminal OUT at the end of gate driver IC 30.

Figure 22:
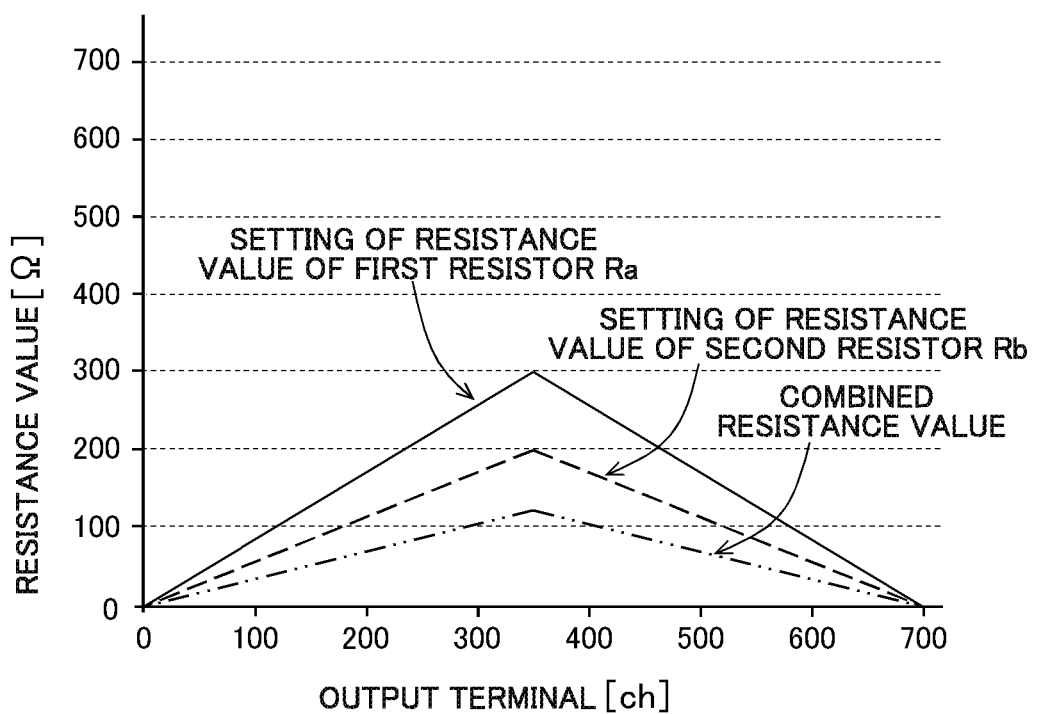
FIG. 22 is a graph illustrating an example of a distribution of the resistance value set to first resistor and second resistor.

The resistance values of first resistor Ra and second resistor Rb are set to different values. FIG. 22 is a graph illustrating an example of a distribution of the resistance value set to first resistor Ra and second resistor Rb. As illustrated in FIG. 22, for first resistor Ra and second resistor Rb, the resistance value is set so as to be the largest in resistor R connected to output terminal OUT in the center of gate driver IC 30, and so as to be the smaller toward resistor R connected to output terminal OUT at the end of gate driver IC 30 from the center of gate driver IC 30. The resistance value of second resistor Rb is set so as to be smaller than the resistance value of first resistor Ra. FIG. 22 illustrates a resistance value (combined resistance value) in which the resistance values of first output transistor Tra and second output transistor Trb, which are connected in parallel, are combined. Each resistance distribution in FIG. 22 has a different functional characteristic (in this case, linearity).

In the above configuration, resistance distributions of three patterns can be set by one gate driver IC 30. For example, for display panel 10 in which lead line 12a has the resistance distribution in FIG. 13, lead line 12a is connected to first resistor Ra (first pattern). For example, for display panel 10 in which lead line 12a has the resistance distribution in FIG. 14, lead line 12a is connected to second resistor Rb (second pattern). For example, for display panel 10 in which lead line 12a has the resistance distribution in FIG. 15, lead line 12a is connected in parallel to first resistor Ra and second resistor Rb (third pattern). In each pattern, the on-resistance value is set by output transistor Tr of shift register circuit SR. Therefore, the homogenization of the resistance value of lead line 12a can be achieved according to the characteristics of each display panel 10.

Figure 23:
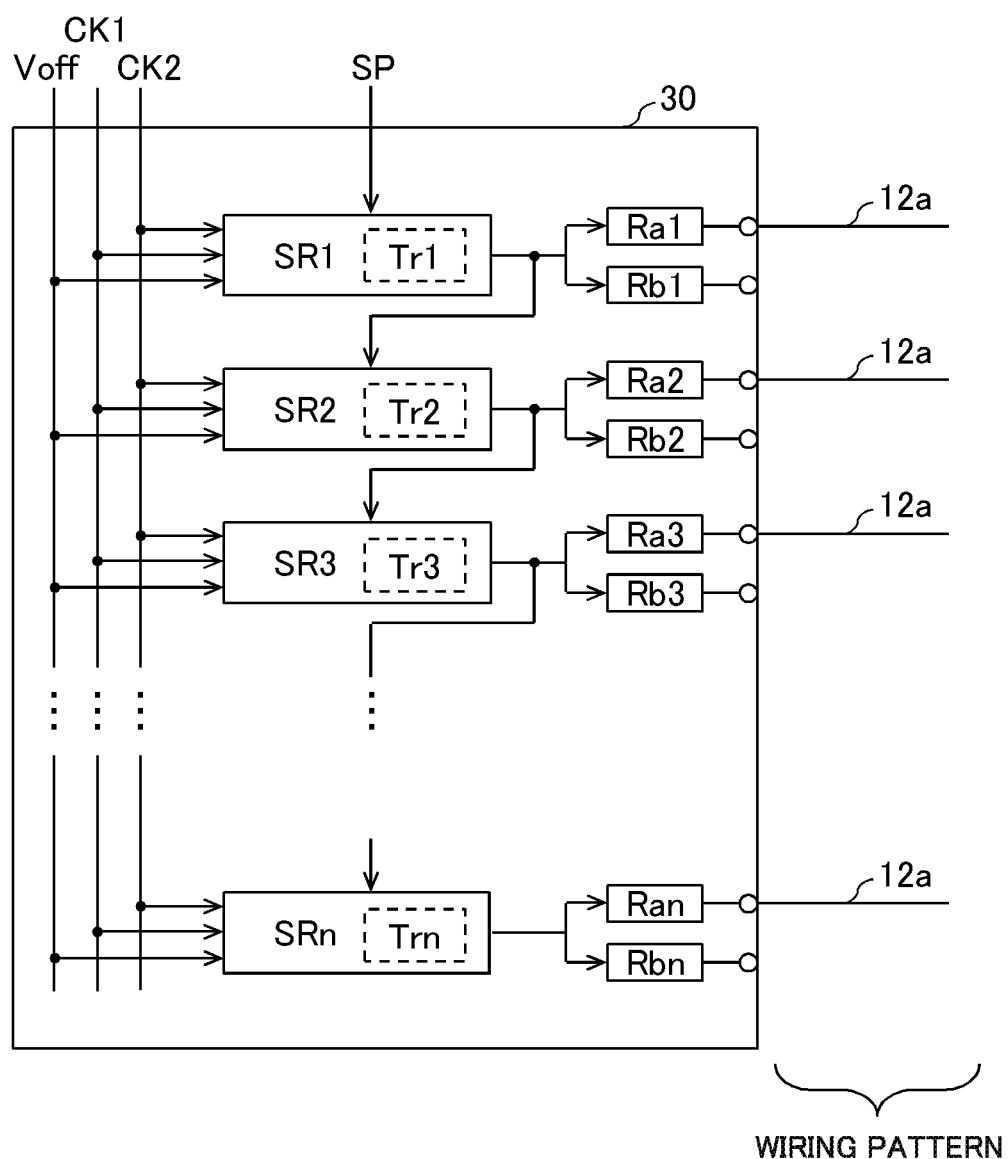
FIG. 23 illustrates a connection configuration of the first pattern of the gate driver IC and the lead lines.
Figure 24:
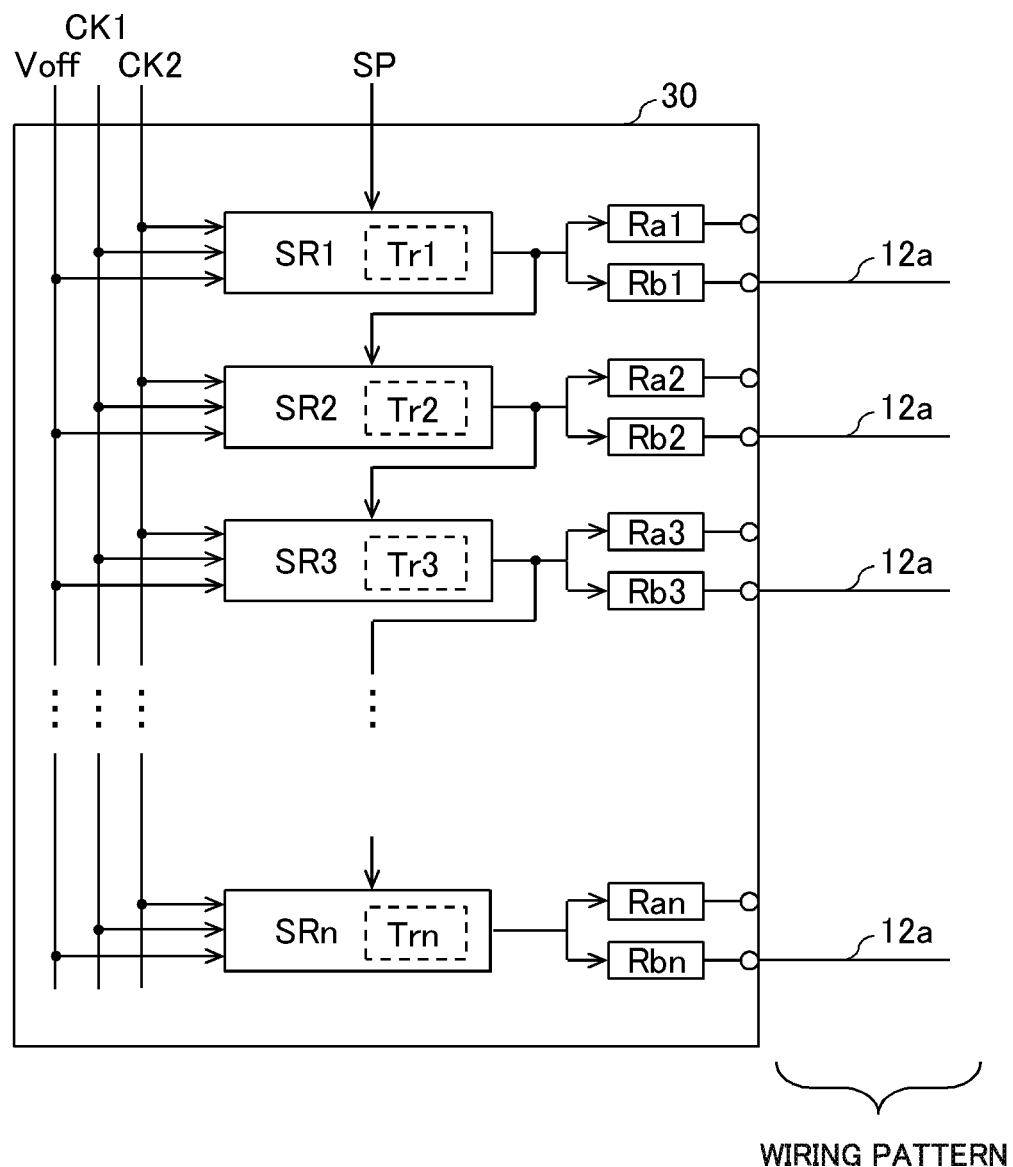
FIG. 24 illustrates a connection configuration of the second pattern of the gate driver IC and the lead lines.
Figure 25:
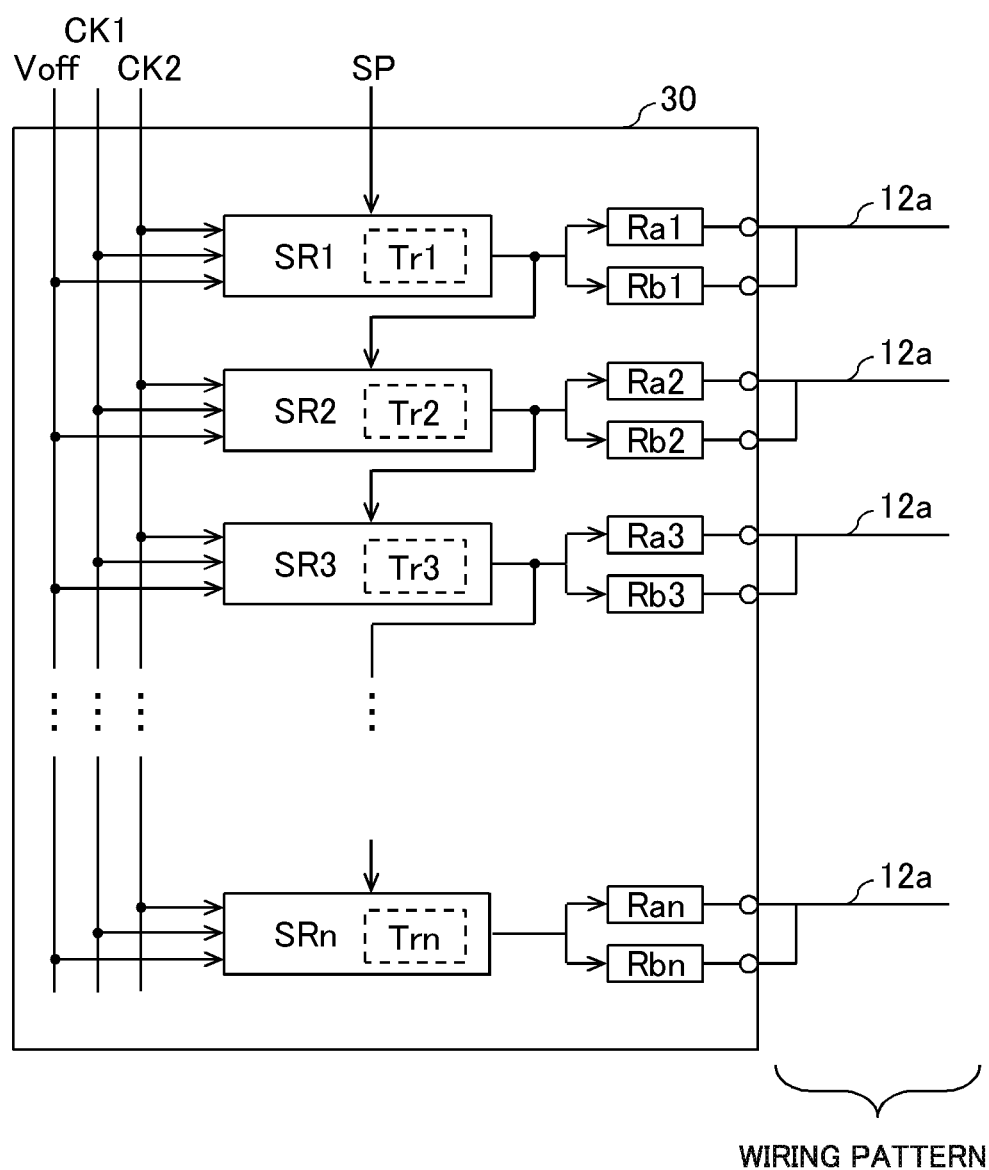
FIG. 25 illustrates a connection configuration of the third pattern of the gate driver IC and the lead lines.

Thus, a connection destination (the output terminal of gate driver IC 30) of lead line 12a is changed according to the kind (such as the size and the resolution) of display panel 10 without changing design of gate driver IC 30, so that the homogenization of the resistance value of each lead line 12a can be achieved. FIG. 23 illustrates a connection configuration of the first pattern, FIG. 24 illustrates a connection configuration of the second pattern, and FIG. 25 illustrates a connection configuration of the third pattern. A method for connecting the first to third patterns can be performed by forming the corresponding wiring pattern in a process of manufacturing the TFT substrate.

Figure 26:
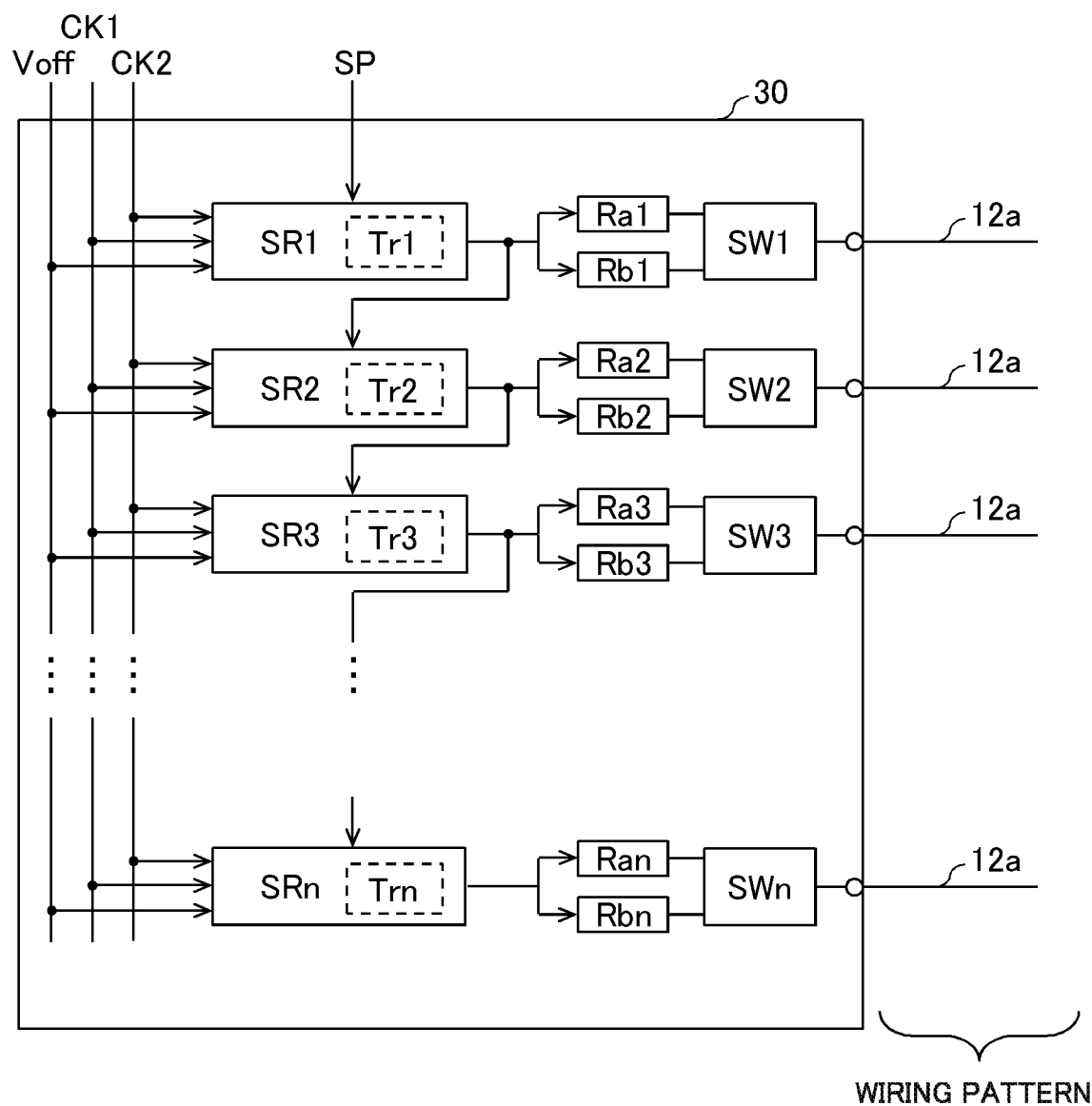
FIG. 26 is a view illustrating another configuration of the gate driver IC.

The connection switching of the first to third patterns may be performed by a switch circuit. FIG. 26 is a view illustrating still another circuit configuration of gate driver IC 30. As illustrated in FIG. 26, in gate driver IC 30, switch circuit SW is provided between the output terminals of first resistor Ra and second resistor Rb, which are connected in parallel and output terminal OUT of gate driver IC 30. In the configuration of FIG. 26, the first to third patterns are switched by switch circuit SW according to the kind of display panel 10. Therefore, the resistance value of each lead line 12*a* can be homogenized according to the kind of display panel 10. A known configuration can be adopted to switch circuit SW.

The present disclosure is not limited to the exemplary embodiment. For example, output transistor Tr may have the same size in each shift register circuit SR. In this case, a small number of output transistors Tr are disposed in shift register circuit SR on the central side, and the number of output transistors Tr disposed in shift register circuit SR may be increased toward both the ends.

For example, resistor R needs not to be provided in a high-resistance-value region of lead line 12*a*. There is no limitation on the number of resistors R connected to one shift register circuit SR. For example, three resistors R are connected to shift register circuit SR on the central side, the number of resistors R connected to one shift register circuit SR is decreased toward both the ends, and resistor R needs not to be connected to shift register circuits SR on both the end sides.

Figure 27A:
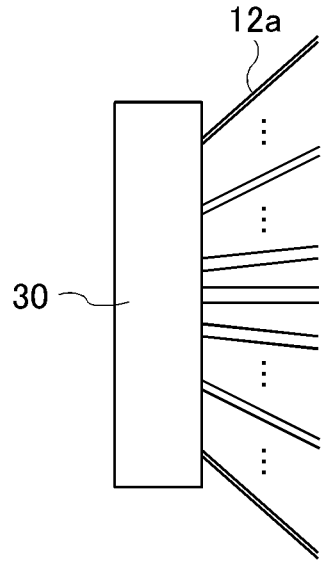
FIGS. 27A and 27B illustrate other configurations of lead lines.
Figure 27B:
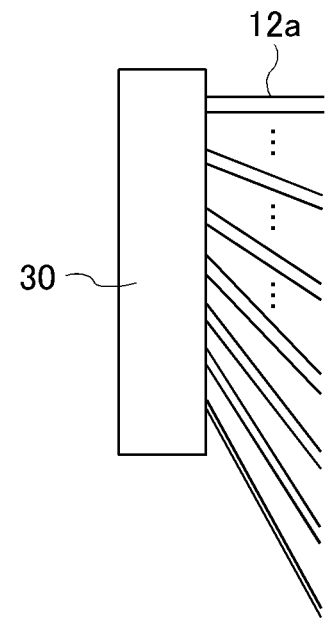

The widths of lead lines 12*a* may be equal to or different from each other. For example, with decreasing length of lead line 12*a*, lead line 12*a* may be widened. For example, as illustrated in FIG. 27A, lead line 12*a* connected to the output terminal disposed on the central side of gate driver IC 30 may be widened, and lead line 12*a* connected to the output terminal disposed on both the end sides of gate driver IC 30 may be narrowed. As illustrated in FIG. 27B, lead line 12*a* connected to the output terminal disposed on one end side (an upper end side in FIG. 27B) of gate driver IC 30 may be widened, and lead line 12*a* connected to the output terminal disposed on the other end side (a lower end side in FIG. 27B) of gate driver IC 30 may be narrowed.

Figure 28:
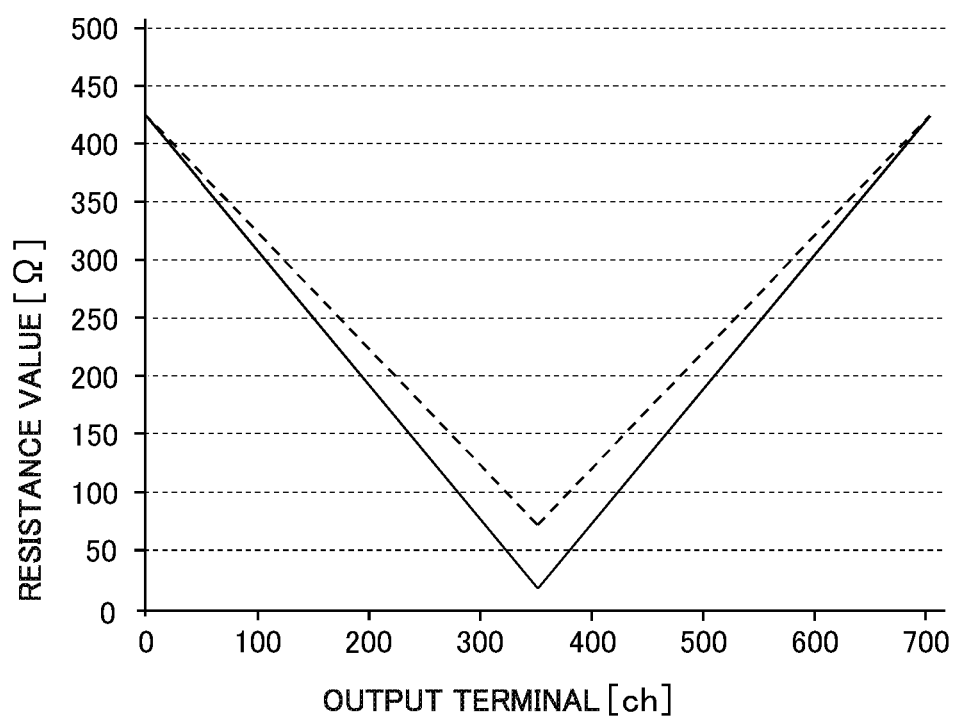
FIG. 28 is a graph illustrating a simulation result of a resistance distribution of lead line in FIG. 27A.

When the configuration in FIG. 27A is compared to the configuration in FIG. 3A, the width of lead line 12*a* in FIG. 27A is equal to the width of lead line 12*a* in FIG. 3A on both the end sides of gate driver IC 30, and becomes larger than the width of lead line 12*a* in FIG. 3A toward the central side of gate driver IC 30. FIG. 28 is a graph illustrating a simulation result of a resistance distribution of lead line 12*a* in FIG. 27A. The resistance distribution (see FIG. 4) of lead line 12*a* corresponding to the configuration in FIG. 3A is illustrated by a dotted line in FIG. 28. As can be seen from FIG. 28, compared with the configuration in FIG. 3A, the resistance value of lead line 12*a* is decreased from the output terminal at the end to the central output terminal.

Figure 29:
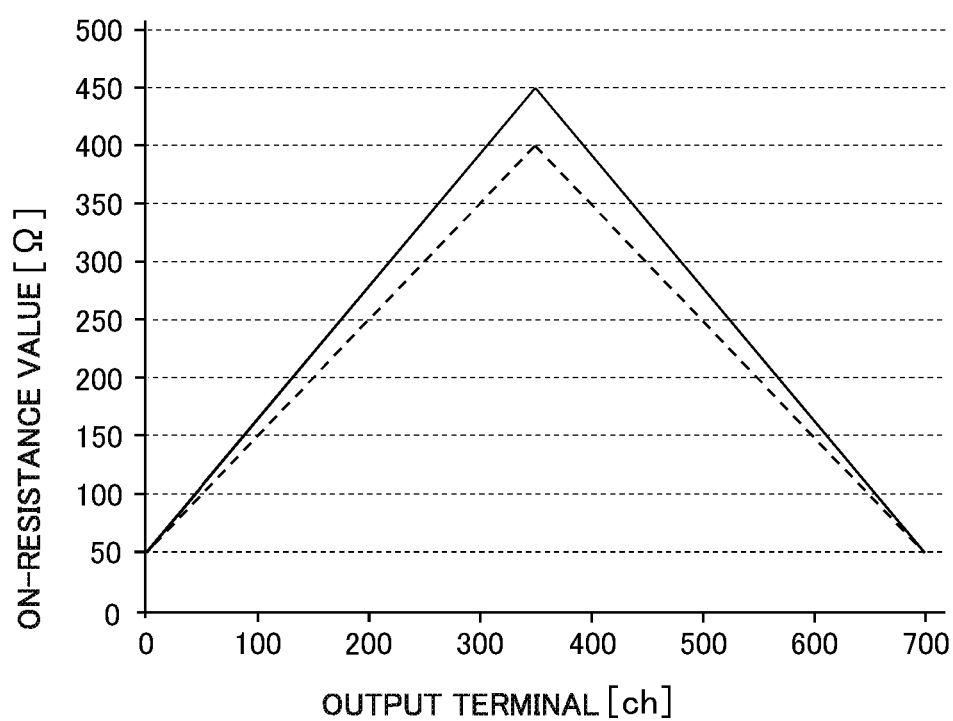
FIG. 29 is a graph illustrating a distribution of an on-resistance value set to output transistor corresponding to the resistance distribution of lead lines in FIG. 28.

For the configuration in FIG. 27A, the on-resistance value of output transistor Tr is set higher than the on-resistance value (see FIG. 8) of output transistor Tr corresponding to the configuration in FIG. 3A. FIG. 29 is a graph illustrating a distribution of an on-resistance value set to output transistor Tr, the distribution of the on-resistance value corresponding to the resistance distribution of lead line 12*a* in FIG. 28. The distribution (see FIG. 8) of the on-resistance value set to output transistor Tr is illustrated by a dotted line in FIG. 29, the distribution of the on-resistance value corresponding to the resistance distribution of lead line 12*a* in FIG. 4. Thus, the on-resistance value of output transistor Tr may be set in consideration of both the length and width of the lead line. In the case where gate driver IC 30 includes resistor R, the resistance value of resistor R may be considered in FIG. 29.

Although exemplary embodiments of the present disclosure are described above, the present disclosure is not limited to these exemplary embodiments. It is noted that exemplary embodiments properly changed from the exemplary embodiments described above by those skilled in the art without departing from the scope of the present disclosure are included in the present disclosure.

What is claimed is:

1. A display device comprising:
    a display panel in which a plurality of signal lines and a plurality of lead lines electrically connected to the plurality of signal lines are provided; and
    a driving circuit including a plurality of output circuits that output a signal to the plurality of lead lines and output transistors that are provided in the output circuits and connected to output terminals of the output circuits,
    wherein on-resistance values of the output transistors are set according to resistance values of the lead lines electrically connected to the output transistors, an on-resistance value of an output transistor of the output transistors being set so as to become smaller as a length of a lead line of the plurality of lead lines electrically connected to the output transistor increases, and so as to become larger as the length of the lead line decreases, and
    among the plurality of lead lines, longer ones of the lead lines are narrower than shorter ones of the lead lines.

2. The display device according to claim 1, further comprising a resistor that is electrically connected to an output terminal of at least one of the plurality of output circuits, wherein
    a resistance value of the resistor is set according to the resistance values of the lead lines electrically connected to the resistor.

3. The display device according to claim 1, wherein
    a part of the plurality of lead lines extends in a direction oblique to a direction in which the plurality of signal lines electrically connected to the driving circuit extend.

* * * * *